(12) United States Patent
Kawashima

(10) Patent No.: US 12,107,394 B2
(45) Date of Patent: Oct. 1, 2024

(54) REFLECTOR, SURFACE-EMITTING LASER, LIGHT SOURCE, PROJECTION DEVICE, DISPLAY DEVICE, LIGHT-EMITTING DEVICE

(71) Applicant: Takeshi Kawashima, Miyagi (JP)

(72) Inventor: Takeshi Kawashima, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 794 days.

(21) Appl. No.: 17/236,275

(22) Filed: Apr. 21, 2021

(65) Prior Publication Data

US 2021/0336421 A1  Oct. 28, 2021

(30) Foreign Application Priority Data

Apr. 22, 2020 (JP) ................. 2020-076342
Apr. 19, 2021 (JP) ................. 2021-070686

(51) Int. Cl.
*H01S 5/00* (2006.01)
*H01S 5/183* (2006.01)
*G03B 21/20* (2006.01)
*H01S 5/343* (2006.01)
*H01S 5/42* (2006.01)

(52) U.S. Cl.
CPC ...... *H01S 5/18361* (2013.01); *H01S 5/18347* (2013.01); *G03B 21/2033* (2013.01); *H01S 5/183* (2013.01); *H01S 5/18369* (2013.01); *H01S 5/34333* (2013.01); *H01S 5/423* (2013.01)

(58) Field of Classification Search
CPC .. H01S 5/18361; H01S 5/18347; H01S 5/183; H01S 5/18369; H01S 5/34333; H01S 5/423
See application file for complete search history.

(56) References Cited

U.S. PATENT DOCUMENTS

| | | | | |
|---|---|---|---|---|
| 6,266,355 B1 * | 7/2001 | Sverdlov | ............... | B82Y 20/00 |
| | | | | 372/45.01 |
| 2006/0126688 A1 * | 6/2006 | Kneissl | ............... | H01S 5/22 |
| | | | | 372/43.01 |
| 2014/0106150 A1 * | 4/2014 | Decker | ............... | G06F 3/03 |
| | | | | 428/319.1 |
| 2016/0268774 A1 * | 9/2016 | Kawashima | ............... | H01S 5/0212 |
| 2019/0273360 A1 * | 9/2019 | Kawashima | ............... | H01S 5/02461 |
| 2020/0044416 A1 * | 2/2020 | Kawashima | ............... | H01S 5/2232 |
| 2020/0244043 A1 * | 7/2020 | Kawashima | ............... | H01S 5/34333 |

FOREIGN PATENT DOCUMENTS

JP  2015-076552  4/2015

OTHER PUBLICATIONS

Masaru Kuramoto, et al., "High-Power GaN-Based Vertical-Cavity Surface-Emitting Lasers with AlInN/GaN Distributed Bragg Reflectors", Appl. Sci. 2019, 9, 416; doi:10.3390/app9030416, pp. 1-13.

* cited by examiner

*Primary Examiner* — Kinam Park
(74) *Attorney, Agent, or Firm* — IPUSA, PLLC

(57) ABSTRACT

A reflector includes a low refractive index layer having a first average refractive index; and a high refractive index layer having a second average refractive index. The low refractive index layer includes a laminate of alternate Ga-doped AlN layers and layers consisting essentially of GaN. The high refractive index layer includes an InGaN layer. The second average refractive index is higher than the first average refractive index.

19 Claims, 19 Drawing Sheets

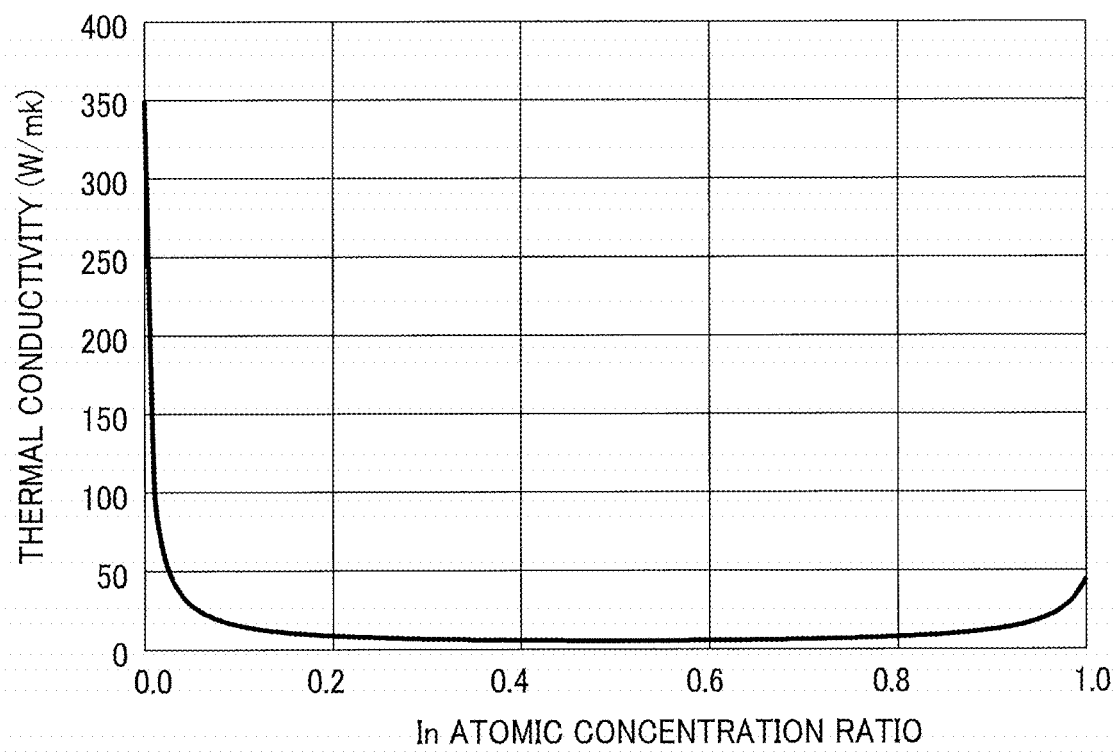

REFLECTOR, SURFACE-EMITTING LASER, LIGHT SOURCE, PROJECTION DEVICE, DISPLAY DEVICE, LIGHT-EMITTING DEVICE

CROSS-REFERENCE TO RELATED APPLICATIONS

This patent application is based on and claims priority pursuant to 35 U.S.C. § 119(a) to Japanese Patent Application No. 2020-076342, filed on Apr. 22, 2020 and Japanese Patent Application No. 2021-070686, filed on Apr. 19, 2021, in the Japan Patent Office, the entire disclosure of which is hereby incorporated by reference herein.

BACKGROUND

Technical Field

Embodiments of the present disclosure relate to a reflector, a surface-emitting laser, a light source, a projection device, a display device, and a light-emitting device.

Related Art

A conventionally-known vertical cavity surface-emitting laser (VCSEL) has its active layer between a pair of reflectors and includes a resonator oriented in a direction vertical to its substrate. In the surface-emitting laser, a distributed bragg reflection (DBR) of the resonator needs a high reflectivity of 99% or more to repeatedly reflect light emitted from the light emitting layer and amplify the light.

SUMMARY

In an aspect of this disclosure, there is provided A reflector includes a low refractive index layer having a first average refractive index; and a high refractive index layer having a second average refractive index. The low refractive index layer includes a laminate of alternate Ga-doped AlN layers and layers consisting essentially of GaN. The high refractive index layer includes an InGaN layer. The second average refractive index is higher than the first average refractive index.

In another aspect of this disclosure, there is provided a low refractive index layer having a first average refractive index and a high refractive index layer having a second average refractive index. The low refractive index layer includes a laminate of alternate Ga-doped AlN layers and GaN layers. The high refractive index layer includes an InGaN layer. The second average refractive index is higher than the first average refractive index.

In still another aspect of this disclosure, there is provided a light source including a plurality of surface-emitting lasers.

In even another aspect of this disclosure, there is provided a light source including a plurality of surface-emitting lasers. Each of the mesa structures is surrounded by the conductive part.

In yet another aspect this disclosure, there is provided a projection device including the surface-emitting laser.

Further, a projection device includes the light source.

Still further, a light-emitting device includes the surface-emitting laser.

Yet further, a light-emitting device includes the light source.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 23 is a graph of the relation between an atomic (In) concentration ratio with respect to In-doped MN and the thermal conductivity.

Figure 1:
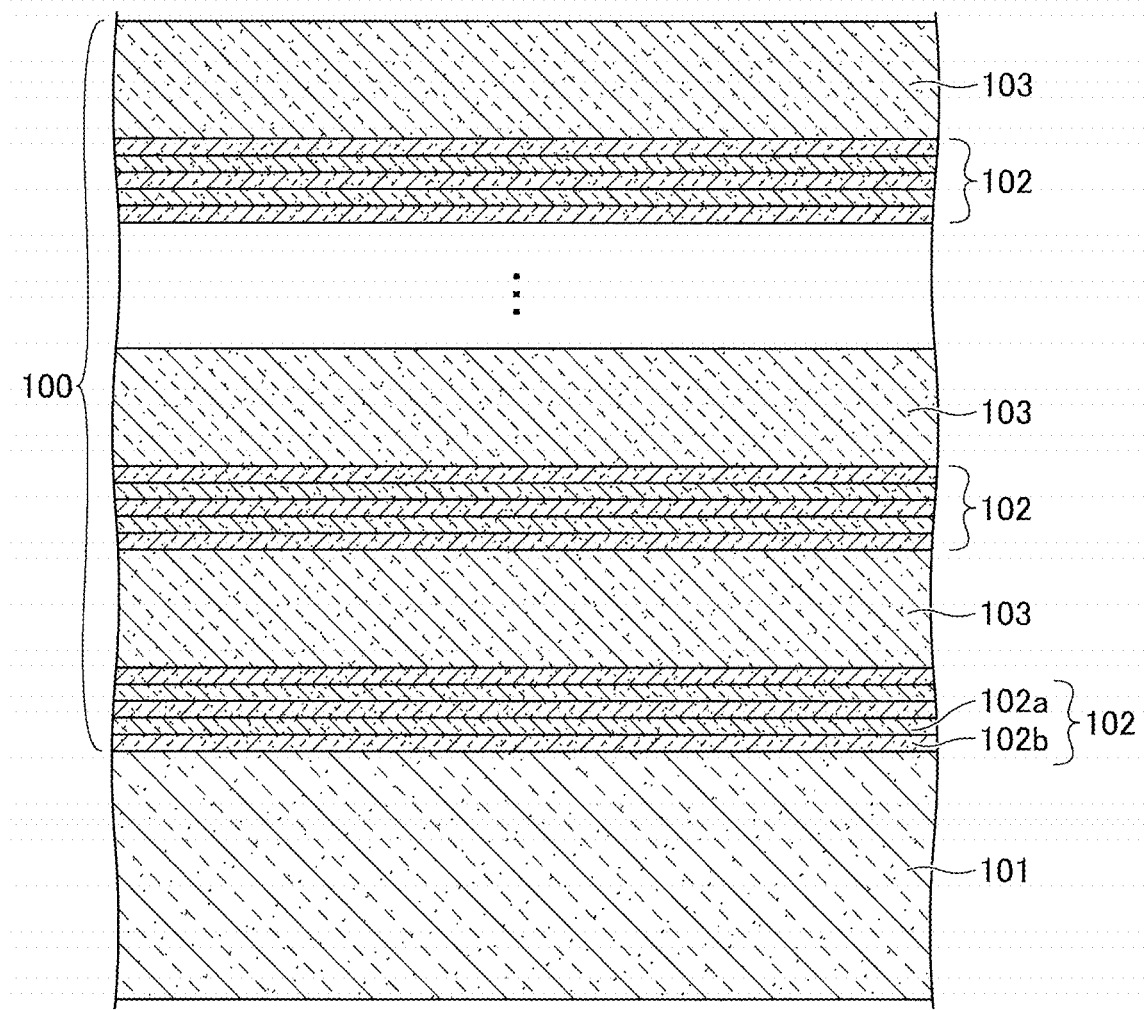
FIG. 1 is a cross-sectional view of a reflector according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The embodiments of the present disclosure achieve a reflector with a high productivity.

Embodiments of the present disclosure are described below with reference to the accompanying drawings. Note that in the description and the drawings of the embodiments of the present disclosure, like reference signs are given to elements with substantially the same functional configuration. Accordingly, overlapping descriptions are omitted where appropriate.

The embodiments to be described below exemplify a reflector, a surface-emitting laser, a light source, a projection device, a display device, and a light-emitting device, which implement the technical concepts of the present disclosure. However, no limitation is intended therein.

First Embodiment

First, a reflector according to the first embodiment is be described. FIG. 1 is a cross-sectional view of a reflector 100 according to the first embodiment of the present disclosure.

As illustrated in FIG. 1, the reflector 100 includes low refractive index layers 102 and high refractive index layers 103 containing InGaN, which are alternately stacked on top of each other. The low refractive index layer 102 has a multilayered structure including alternate layers of multiple Ga-doped AlN 102a layers and multiple GaN 102b layers. The average refractive index of the low refractive index layers 102 (an example of a first average refractive index) is smaller than the average refractive index of the high refractive index layers 103 (an example of the second average refractive index).

The average refractive index of the low refractive index layers 102 is obtained by dividing the sum of the products of an optical film thickness and a refractive index of each layer of a low refractive index layer 102, by the total of the optical film thicknesses of the layers included in the same low refractive index layer 102. The high refractive index layer 103 may be composed of only the InGaN layer. In this case, the average refractive index of the high refractive index layer 103 is a refractive index of the InGaN layer of the high refractive index layer 103.

The reflector 100 is on a substrate 101 including, for example, GaN. For example, the material of the substrate 101 has a GaN lattice constant, and a GaN template in which a GaN substrate or a GaN layer is grown on different types of substrates may be used as the substrate 101. Examples of such different types of substrates include a sapphire substrate, a Si substrate, a GaAs substrate, and a SiC substrate.

In Ga-doped AlN 102a, Ga is doped, which is to be described in detailed in the description of a manufacturing method. Ga-doped AlN 102a can improve flatness more easily than AlN without doped Ga. The amount of Ga doping is within the range that enables the growth of a flat Ga-doped AlN film and obtains a desired reflectivity of the reflector 100. However, too much amount of Ga doping might cause alloy scattering and reduce the thermal conductivity.

Figure 2:
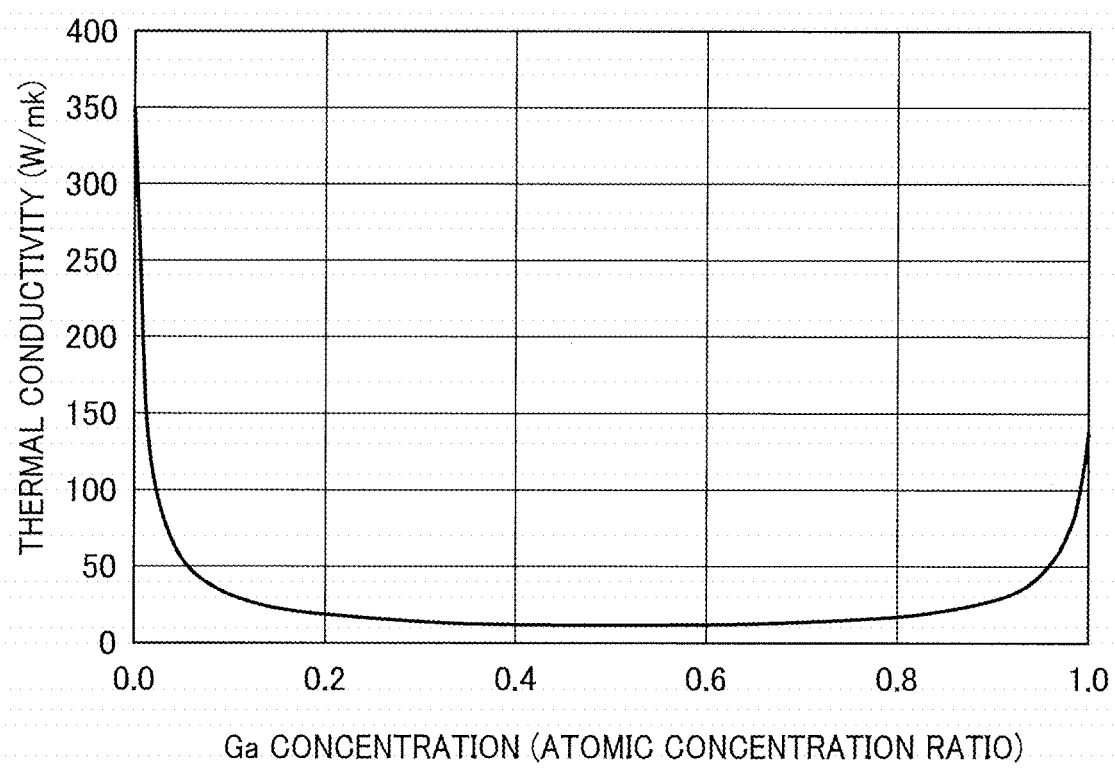
FIG. 2 is a graph of the relation between an atomic (Ga) concentration ratio with respect to Ga-doped MN and the thermal conductivity.

FIG. 2 is a graph of the relation between an atomic concentration ratio of Ga in Ga-doped AlN and the thermal conductivity, which is based on the calculation results of the thermal conductivity of the Ga-doped AlN layer.

The thermal conductivity of a mixed crystal AB of materials A and B is given by $$1/K_{AB} = 1/\{x(1/K_A) + (1-x)(1/K_B) + x(1-x)(1/C_{AB})\} \quad (1)$$

In the equation (1), x denotes the composition of the material A in the mixed crystal AB. In other words, x is the atomic concentration ratio of the material A contained in the material B. Further, $K_{AB}$ denotes the thermal conductivity of the mixed crystal AB, $K_A$ denotes the thermal conductivity of the material A, $K_B$ denotes the thermal conductivity of the material B, $C_{AB}$ denotes a bowing parameter.

The relation of the thermal conductivity and the atomic concentration ratio of Ga in Ga-doped AlN in FIG. 2 is obtained by substituting a thermal conductivity of 350 W/mK for AlN, a thermal conductivity of 150 W/mK for GaN, and a bowing parameter of 3.1 W/mK into equation (1).

With an atomic (Ga) concentration ratio of 0, that is, AlN, the thermal conductivity is a maximum of 350 W/mK. With an atomic (Ga) concentration ratio of 0.03, the thermal conductivity is 80.7 W/mK, which is below the thermal conductivity of GaN. For an atomic (Ga) concentration ratio of 0.05, the thermal conductivity is 4.3 W/mK; and for an atomic (Ga) concentration ratio of 0.10, the thermal conductivity is 30.9 W/mK, which is less than 1/10 of the thermal conductivity of AlN. With increasing atomic (Ga) concentration ratio after that value, the thermal conductivity gradually decreases, and achieves the minimum of 11.6 W/mK at an atomic (Ga) concentration ratio of approximately 0.50. From the above calculation results, the amount of Ga that is doped in AlN is preferably small: the atomic concentration ratio for the Ga concentration is 0.10 or less, more preferably 0.05 or less, and even more preferably 0.03 or less.

The reflector 100 can achieve an extremely high reflectivity (e.g., 99.9% or higher) depending on a combination of the low refractive index layer 102 and the high refractive index layer 103. Further, the Ga-doped AlN layer 102a and the GaN layer 102b according to the present embodiment, which have a higher thermal conductivity than AlGaN with a thermal conductivity of approximately 20% to 40% according to a comparative example, can improve heat dissipation.

Tensile strain occurs in the Ga-doped AlN layer 102a included in the low refractive index layer because of lattice mismatch with the substrate GaN, and compression strain occurs in the InGaN 102b included in the high refractive index layer. The reflector 104 that is formed without strain (i.e., the amount of strain) control might warp its substrate significantly and cause cracks and a pit, thus decreasing the reflectivity. To avoid such a situation, the product of the strain and the total film thickness of the Ga-doped AlN layer 102a is preferably equal to the product of the strain and the total film thickness of InGaN.

As an equal amount of strain is difficult to obtain for each layer during the actual manufacturing of the layers, each film thickness is adjusted to obtain a ratio of the product of the strain and the total film thickness of a Ga-doped AlN layer to the product of the strain and the total film thickness of an InGaN layer, of from 0.8 to 1.2, and more preferably 0.9 to 1.1. The strains is given by the following equation (2) where as denotes the a-axis lattice constant of the substrate (e.g., the a-axis lattice constant of GaN in this example), which is denominator, and Aa denotes the amount of change, which is numerator, (i.e., a value obtained by subtracting the a-axis lattice constant (as) of GaN from the a-axis lattice constant $(a_e)$ of InGaN or Ga-doped AlN.

$$\varepsilon = \Delta a/a_s = (a_e - a_s)/a_s \quad (2)$$

The Ga-doped AlN has a large lattice constant difference from the substrate of GaN, and the largest lattice strain in the reflector 100 occurs in the Ga-doped AlN. A single thick layer of such Ga-doped AlN that is grown on the low refractive index layer might cause misfit dislocation and surface roughness due to the accumulation of strain, thus reducing the reflectivity.

In the configuration according to the present embodiment, the low refractive index layer includes multiple Ga-doped AlN layers 102a and multiple GaN layers 102b, and the Ga-doped AlN layer 102a include one layer with a thickness of 20 nm or less and more preferably 15 nm or less. Still more preferably, the Ga-doped AlN layer 102a has two or more layers each with a thickness of 10 nm or less. As the GaN layer 102b causes no strain, its film thickness is not particularly limited. The GaN layer 102b preferably uses GaN. However, in some cases, the GaN layer 102b mainly contains GaN, into which a slight amount of Al or In is doped and which has substantially the same lattice constant as the substrate of GaN.

The low refractive index layers 102 and the high refractive index layer 103 have an optical film thickness (i.e., the product of the refractive index and the film thickness) that is equivalent to $\lambda/4$ where $\lambda$ is a reflection wavelength of the reflector 100. In some examples, a film thickness of each layer is increased or decreased assuming that the sum of the optical film thicknesses of the low refractive index layer and the high refractive index layer is X/2, so as to adjust the above-described strain E. As Ga-doped AlN has a smaller refractive index than GaN, the reflectivity is increased by setting the optical film thickness of the high refractive index layer to greater than $\lambda/4$, and setting the optical film thickness of the low refractive index layer to less than $\lambda/4$.

With increasing the optical film thickness of the high refractive index layer to be greater than $\lambda/4$, the film thickness of the Ga-doped AlN layer in the low refractive index layer is also increased to achieve intended strain compensation. To obtain the sum of the optical film thicknesses, the film thickness of the GaN layer is to be reduced by an increase from $\lambda/4$ in the film thickness of the high refractive index layer and also an increase in the film thickness of the Ga-doped AlN for strain compensation.

As a result, the refractive index of the low refractive index layer is lower for the structure in which the high refractive index layer is greater than $\lambda/4$, and the low refractive index layer is less than $\lambda/4$, than the structure in which the optical film thickness is $\lambda/4$. Further, The refractive index difference is greater for the structure in which the high refractive index layer is greater than $\lambda/4$, and the low refractive index layer is less than $\lambda/4$, than the structure in which the optical film thickness is $\lambda/4$. This configuration can increase the reflectivity of the reflector more.

A GaN layer between the Ga-doped AlN layer 102a and the InGaN layer of the high refractive index layer 103 serves as a buffer layer, which increases crystal quality. For this reason, a GaN layer as a outermost layer is on the both sides, the surface side and the substrate side, of the low refractive index layers 102.

When In composition of the InGaN layer included in the high refractive index layer 103 exceeds 0.20, a sufficient thermal conductivity might not be obtained. To obtain desired thermal conductivity, the In composition of the InGaN layer is preferably less than 0.20, and more preferably less than 0.10.

In contrast, when the In composition of the InGaN layer is less than 0.02, the compression strain generated in the InGaN layer becomes small, and the strain of the Ga-doped AlN layer 102a may not be sufficiently compensated. The In composition of the InGaN layer is preferably 0.02 or greater, and more preferably 0.03 or greater to successfully compensate strain.

In some examples, the high refractive index layer 103 include a laminate of layers including alternate InGaN layers and GaN layers. The high refractive index layer 103 including the GaN layers improves heat dissipation more. To obtain desired thermal conductivity and strain, the In composition in the high refractive index layer 103 as a whole is preferably 0.02 or greater and less than 0.20, and more preferably 0.03 or greater and less than 0.10.

The above-described multilayered structure of the Ga-doped AlN layers and the GaN layers, and InGaN layers are alternately deposited to form a laminate of layers. This laminate of layers achieves a reflector with high quality and high heat dissipation.

Next, a method of manufacturing the reflector 10 is described according to an embodiment.

Examples of the manufacturing method includes, but not limited to, the metal-organic chemical vapor deposition (MOCVD), the molecular beam epitaxy (MBE), the plasma enhanced chemical-vapor deposition (PECVD), and the hydride vapor phase epitaxy (HYPE). Hereinafter, cases in which the MOCVD is employed are described.

In the MOCVD, row materials such as trimethylgallium (TMG), trimethylaluminum (TMA), and trimethylindium (TMI) are used as group III material. In some examples, Ammonia (NH3) is used as a nitrogen raw material. As the impurity for controlling conductivity, silane or disilane as a donor impurity, monogerman as a Ge source, or the like can be used. As the acceptor impurity, cyclopentadienyl magnesium or the like as an Mg source can be used. The growth of each layer is controlled by opening and closing the valves of the group III raw material and the impurity raw material while supplying NH3.

After setting the substrate in the reactor of the manufacturing device, the substrate is heated to 700° C. or higher and lower than 1000° C. while supplying carrier gas and NH3 as a nitrogen raw material. Then, the group III raw material is supplied to grow alternately low refractive index layers 102 and high refractive index layers 103 to form a reflector. The temperature may be raised to 1000° C. or higher (for example, 1100° C.) as long as the productivity is not impaired, which is to be described later. In such a manner, the reflector 100 can be manufactured. For the order of laminating layers, either one of the low refractive index layer and the high refractive index layer may be first laminated.

The product PAlN of the strain and the total film thickness of the Ga-doped AlN and the product $P_{InGaN}$ of the strain and the total film thickness of the InGaN layer are adjustable with these film thicknesses, for example.

In Example 4 to be described later, a conductive buffer layer is first formed on the substrate, and then, the low refractive index layers 102 and the high refractive index layers 103 are alternately grown on the buffer layer. Such a buffer layer enables better crystal quality. In this case, the substrate on which the buffer layer is formed is regarded as a single conductive substrate.

In the MOCVD, TMA, which is used as Al raw material for AlN or AlGaN, causes an irreversible parasitic reaction that does not contribute to growth when mixed with NH3 used as a nitrogen raw material in the gas phase. For AlGaN, a V/III ratio, which is a molar ratio of NH3, or a group V raw material, to group III raw material is 1000 to 10000 during the growth, so as to prevent desorption of nitrogen and obtain desired crystal quality. The parasitic reaction tends to markedly occur with such high V/III ratios, and the growth rate may decrease with a decrease in the uptake of Al in the solid phase.

Under conditions that prevent such a parasitic reaction, for example, a decrease in the V/III ratio might cause desorption of nitrogen and generate defects, resulting in a deterioration in crystal quality. As the Al atom has a stronger bond with the nitrogen atom than the Ga and In atoms, the desorption of nitrogen is less likely to occur through formation of the Ga-added AlN layer with a V/III ratio of less than 1000. In other words, the layer can be grown with a V/III ratio of less than 1000.

In some cases, growing a Ga-doped AlN with a V/III ratio of 1000 or more might cause a decrease in the amount of Al supplied to the substrate surface, and slightly reduces the growth rate. With the V/III ratio of 1000 or more, however, the GaN layer and the InGaN layer can grow at high speed, and good productivity of the reflector 100 as a whole is achieved.

Although the growth temperature may be different between the low refractive index layers 102 and the high refractive index layer 103, the growth temperature is preferably 700° C. or higher and lower than 1000° C. When the growth temperature is lower than 700° C., desired crystallinity might not be obtained. The growth temperature of 1000° C. or higher hampers uptake of In into the InGaN layer and inhibits the formation of an InGaN layer. In view of such circumstances, the growth temperature of the low refractive index layers 102 and the high refractive index layer 103 is preferably 700° C. or higher and lower than 1000° C. For another example, the GaN layer grown at approximately 900° C. can obtain desired flatness. In view of such an example, the growth temperature of the low refractive index layers 102 and the high refractive index layer 103 is preferably 800° C. or higher and lower than 950° C.

When, for example, AlGaN having an Al composition of approximately 10% to 50% is used for the low refractive index layer, the optimum growth temperature ranges from 1000° C. to 1100° C. For the Ga-doped AlN layer, however, its quality less likely deteriorates even at lower than 1000° C. unlike AlGaN. As Al atoms undergo little migration in the temperature range of 700° C. to 1000° C. and in the temperature range of 1000° C. to 1100° C., the difference in crystal quality due to temperature is unlikely to occur. For this reason, the low refractive index layer and the high refractive index layer can be grown at the same temperature.

The low refractive index layer and the high refractive index layer basically grow at the same temperature, and the substrate temperature undergoes no overshoot or undershoot by using a proportional integral derivative (PID) with a difference in temperature of approximately plus/minus several degrees to +10° C. between layers. The substrate temperature can be changed in the range of plus/minus several degrees to +10° C. during the time for changing gas and pressure of layers. With a growth temperature difference within 200° C. between the low refractive index layer and the high refractive index, the substrate can be heated and cooled in a few minutes. The substrate temperature can be changed with the low refractive index layer and the high refractive index layer.

The growth temperature of the low refractive index layers 102 and the high refractive index layer 103 is preferably kept substantially constant. When the growth temperature of the low refractive index layer 102 and the high refractive index layer 103 is changed, particularly with a temperature difference of 200° C. or higher, the productivity decreases because a next growth cannot be performed until the temperature stabilizes after a start of a temperature change. In particular, the In composition of the InGaN layer is susceptible to temperature.

When AlGaN is used for the low refractive index layer, and the growth temperature difference is 200° C. or higher, the total of the time required for raising the temperature and the time required for temperature stabilization after that is estimated to be 5 minutes, and the time required for the temperature decrease and the time required for the temperature stabilization after that is estimated to be 15 minutes in total. In this case, it takes about 17 to 20 hours unlike the manufacturing method according to the present embodiment.

Further, while the growth is interrupted to change the temperature, Si is desorbed from a quartz member used for a reactor or a tray on which the substrate is installed, and impurities that is doped into the low refractive index layers 102 and the high refractive index layer 103 to exhibit conductivity is concentrated (i.e., the impurities collect in high concentration) or segregated on the substrate surface.

Such a concentration or segregation of impurities might damage an interface between the low refractive index layer 102 and the high refractive index layer 103, leading to a decrease in crystallinity and reflectivity. To avoid such a situation, the growth temperature of the low refractive index layers 102 and the high refractive index layer 103 is kept constant, and the growth interruption time is reduced as much as possible.

Doping impurities of approximately $1 \times 10^{18}$ cm$^{-3}$ into the low refractive index layers 102 and the high refractive index layer 103 can reduce the impurity concentration at the interface into $1 \times 10^{21}$ cm$^{-3}$ or less. Further, undoping can reduce the impurity concentration to $1 \times 10^{17}$ cm$^{-3}$. Notably, undoping means that impurities are not intentionally doped, and the concentration of residual impurities in the crystal is $1 \times 10^{17}$ cm$^{-3}$ or less.

Such a method enables one pair (one cycle) of the low refractive index layers 102 and the high refractive index layer 103 to be grown in approximately 5 minutes, and achieves a reflector 100 including the low refractive index layers 102 and the high refractive index layers 103, which correspond to 50 to 60 cycles of the low refractive index layer 102 and the high refractive index layer 103 grown in approximately 4 to 5 hours.

Preferably, the low refractive index layer preferably grows at the same temperature as InGaN contained in the high refractive index layer. However, if the low refractive index layer uses AlN without doped Ga, a pit occurs in the layer even without a decrease in crystal quality. Al atoms, which have a strong bonding force, undergo no migration. For this reason, crystals of AlN might fail to be continuous and result in streaks on a thin film AlN used as a multilayer structure in the low refractive index layer.

When the growth temperature of the low refractive index layer is 1000° C. or higher, which is optimal for the growth of GaN, gaps in AlN is filled with Ga atoms to migrate as the Ga atoms can actively migrate on the surface of the substrate. This allows a flat layer to be easily grown.

At the temperatures of 700° C. to lower than 1000° C., which are desired growth temperature for the reflector 100 according to the present embodiment, the Ga atoms less actively undergo migration than at the temperatures of 1000° C. or higher. Growing a GaN layer on an AlN layer grown in streaks creates a gap, which might appear as a pit on the surface of the reflector.

However, doping a small amount of Ga atoms, which less actively migrate on the substrate surface, during the growing of AlN allows the Ga atoms to contribute to wettability of the Al atoms on the surface, and easily achieve a flat AlN layer without any gaps. In other words, a flat Ga-doped AlN layer is obtained.

An InGaN layer can be grown in a nitrogen atmosphere. Attempting to grow an InGaN layer in a hydrogen atmosphere fails because In cannot be taken into the layer at all. For this reason, although the Ga-doped MN and the GaN layer may be grown in either one of the nitrogen atmosphere and the hydrogen atmosphere, the InGaN layer is preferably grown in the nitrogen atmosphere.

When the AlN layer and the GaN layer are grown in a hydrogen atmosphere, In might undergo desorption from the surface of the InGaN layer when the nitrogen atmosphere for growing the InGaN layer is switched to the hydrogen atmosphere. When the low refractive index layer 102 is grown, GaN is grown on InGaN in a nitrogen atmosphere as a protective film, or a set of the first AlN layer 102a and a GaN layer 102b is grown in a nitrogen atmosphere, and the other layers are grown in a hydrogen atmosphere.

The above-described manufacturing method manufactures a reflector 100 with high productivity, high quality, and high heat dissipation. Such a reflector 100 includes a laminate of layers in which a multilayered structure (i.e., the Ga-doped AlN layers and the GaN layers) and InGaN layers are alternately deposited.

Next, the action and effects of the reflector 100 are described.

In a conventionally-known VCSEL, a thin active layer is between a pair of reflectors, and a resonator is arranged in a direction vertical to its substrate. In such a surface-emitting laser, a DBR of the resonator needs a high reflectivity of 99% or more to repeatedly reflect light emitted from the light emitting layer and amplify the light.

To compensate the strain of the shape of the DBR, the high refractive index layer uses InGaNk the low refractive index layer uses AlGaN, and the buffer layer between the InGaN and the AlGaN uses GaN. In this configuration, each of the layers constituting the DBR grows under predetermined growth conditions. Specifically, InGaN grows at temperatures of 600° C. to 900° C., and AlGaN grows at temperatures of 1000° C. or higher. For example, after growing InGaN of a high refractive index layer at 800° C., the substrate temperature is raised to grow AlGaN of a low refractive index layer at 1000° C. or higher. Then, the substrate temperature is lowered to 800° C. again to grow InGaN.

In the structure with a buffer layer including GaN between InGaN and AlGaN, however, the In composition of InGaN relies on the growth temperature, and In cannot be taken into InGaN at all at temperatures of 1000° C. or higher, which are optimum growth temperature for AlGaN. In view of such circumstances, AlGaN is first grown, and then, the substrate temperature is reduced to the optimum growth temperature of InGaN to grow InGaN. However, as the substrate temperature does not immediately reach the set temperature, a waiting time of several minutes to a dozen minutes occurs. Similarly, a waiting time when raising the temperature from the optimum temperature of InGaN to the optimum temperature of AlGaN, a waiting time until the temperature reaches the target temperature to stabilize occurs when the optimum temperature of InGaN is raised to the optimum temperature of AlGaN.

For a waiting time for the substrate temperature change and the temperature stabilization, it takes several hours to dozens of hours to raise or lower the temperature to grow approximately 40 to 60 pairs (i.e., cycles) for the DBR with a reflectivity of 99% or more although such a waiting time depends on the structure. Such a waiting time significantly reduces the productivity. As AlGaN used for the low refractive index layer is a ternary mixed crystal, the thermal conductivity is poor due to alloy scattering, and the heat dissipation characteristics of the surface-emitting laser may be deteriorated.

The configuration according to the present embodiment, however, includes a low refractive index layer having a first average refractive index and a high refractive index layer having a second average refractive index higher than the first average refractive index. Further, the low refractive index layer has a laminate of layers in which Ga-doped AlN layers and GaN layers are alternately deposited. The high refractive index layer includes an InGaN layer.

Doping Ga into an AlN layer allows the low refractive index layers 102 and the high refractive index layer 103 to grow at the same temperature, and temperature changes for growing the low refractive index layers 102 and for growing the high refractive index layer 103 are not needed. This eliminates the need for a waiting time until the temperature stabilizes after a start of a temperature change, and allows the low refractive index layers 102 and the high refractive index layer 103 to grow in a short time. This can increase the productivity of the reflector 100 and achieve a reflector 100 with a high productivity.

The Ga-doped MN layer 102a and the GaN layer 102b according to the present embodiment has a thermal conductivity higher than a thermal conductivity of approximately 20% to 40% of AlGaN. This configuration achieves a higher heat dissipation than the configuration that uses GaN as a buffer layer between the InGaN layer and the AlGaN layer.

A reflector according to a comparative example includes the low refractive index layer including alternate AlN layers and GaN layers; and the high refractive index layer including an InGaN layer. Such a configuration according to the comparative example causes cracks and a pit, and reduces the reflectivity of the reflector. In contrast, the configuration according to the present embodiment contributes to wettability of Ga that is doped into the AlN layer 102a. Thus, a Ga-doped MN layer with a desired flatness and without any gap can be easily formed. Such a flat Ga-doped AlN achieves a reflector 100 with a higher reflectivity.

In the present embodiment, the atomic concentration ratio (i.e., the Ga concentration) in the Ga-doped AlN is greater than 0 and less than or equal to 0.10. This configuration can increase the thermal conductivity of the Ga-doped AlN and achieve a desired heat dissipation of the reflector 100.

In the present embodiment, the high refractive index layer 103 has an optical film thickness different from the optical film thickness of the low refractive index layers 102. More specifically, the high refractive index layer 103 has a greater optical film thickness than the low refractive index layers 102. Such a configuration increases a refractive index difference between the high refractive index layer 103 and the low refractive index layers 102, and increases the reflectivity of the reflector 100.

In the present embodiment, the In composition of the InGaN layer is greater than or equal to 0.03 and less than 0.20. The In composition of 0.03 or greater in the InGaN layer can successfully compensate the strain of the Ga-doped AlN layer 102a. The In composition of less than 0.20 in the InGaN layer achieves desired thermal conductivity of the InGaN layer and heat dissipation of the reflector 100.

Tenth Embodiment

Figure 22:
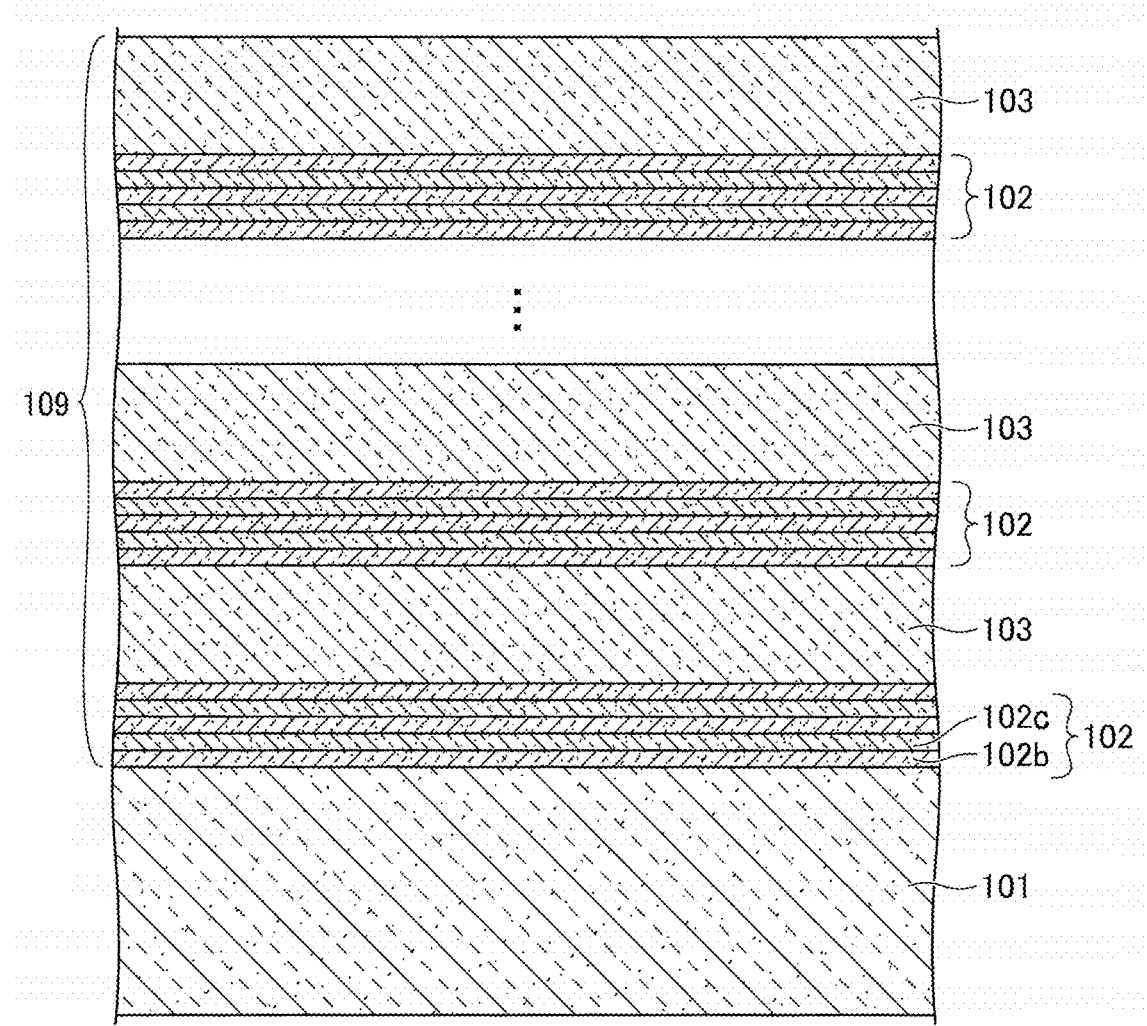
FIG. 22 is a cross-sectional view of a configuration of a reflector according to the tenth embodiment.

A reflector according to the tenth embodiment is described below. FIG. 22 is a cross-sectional view of a configuration of a reflector 109 according to the tenth embodiment. The tenth embodiment has the same basic structure as the first embodiment except that AlN is doped with In, instead of Ga. Doping In differs in the following aspects: The reflector 109 according to the tenth embodiment includes In-doped AlN 102c unlike the reflector 100 according to the first embodiment including Ga-doped AlN 102a instead. Similarly to Ga-doped AlN, In-doped AlN can improve the flatness more easily than AlN that is not doped with anything. The amount of In doping is within the range that enables the growth of a flat In-doped AlN film and obtains a desired reflectivity of the reflector 109. However, too much amount of In doping might cause alloy scattering and reduce the thermal conductivity.

FIG. 23 is a graph of the relation between an atomic concentration ratio of In in an In-doped AlN layer and the thermal conductivity, which is based on the calculation results of the thermal conductivity of the In-doped AlN layer.

The results in FIG. 23 are obtained by substituting a thermal conductivity of 350 W/mK for AlN, a thermal conductivity of 45 W/mK for InN, and a bowing parameter of 1.2 W/mK into equation (1).

With an atomic (In) concentration ratio of 0, that is, AlN, the thermal conductivity is a maximum of 350 W/mK. When the atomic concentration ratio of In is 0.01, the thermal conductivity is 103.7 W/mK, which is lower than 130 W/mK of GaN. With an atomic (In) concentration ratio of 0.03, the thermal conductivity is 61.3 W/mK, and with an atomic (In) concentration ratio of 0.05, the thermal conductivity is 28.2 W/mK, which is reduced to $\frac{1}{10}$ or less of the thermal conductivity of AlN. With an atomic (In) concentration ratio of 0.10, the thermal conductivity is 15.4 W/mK, which is reduced to approximately $\frac{1}{10}$ of the thermal conductivity of AlN. With increasing atomic (In) concentration ratio after that value, the thermal conductivity gradually decreases, and achieves the minimum of 5.58 W/mK at an atomic (In) concentration ratio of approximately 0.50. The thermal conductivity of In-doped AlN decreases more significantly than Ga-doped AlN. The amount of In that is doped in AlN, or the atomic concentration ratio, is preferably 0.50 or less, more preferably 0.03 or less, and still more preferably 0.01 or less.

Next, a method of manufacturing the reflector 109 is described according to an embodiment of the present disclosure. The following describes a case where an MOCVD device is used described.

The method of manufacturing the reflector 109, which involves doping In into AlN, is substantially the same as the reflector 100. Such doping In into AlN can improve the flatness the same as doping of Ga.

The amount of In doping in In-doped AlN 102c is preferably small to reflect the thermal conductivity of the reflector 109. The Ga doping is controlled by the mole ratio of Ga in raw material gas, whereas the In doping is controlled by using growth temperature, gas atmosphere, or mole ratio.

For the control of the amount of In doping based on the mole ratio of In supplied to an organic metal row material, the flow rate of raw material gas is employed. However, the mass flow controller that controls the gas supply amount has a minimum flow rate that can be controlled with respect to the full scale. For this reason, there is a limit to reducing the amount of In in raw material gas. Further, an extremely low flow rate of the In raw material gas might decrease flatness, which is improved by doping In in AlN.

For the control of the amount of In doping based on the growth temperature, increasing the growth temperature of In-doped AlN to be higher than the growth temperature of InGaN, the high refractive index layer 103, can improve the flatness and reduce the amount of In doping. However, if the difference in growth temperature between the low refractive index layer 102 and the high refractive index layer 103 becomes large, it takes time to raise and lower the temperature. In view of this, the growth temperature of the high refractive index layer 103 is increased within the range that does not impair productivity. Hydrogen is used as the carrier gas to control the amount of In that is to be doped in the gas atmosphere. A nitride semiconductor containing In becomes difficult to incorporate In if hydrogen is contained in the carrier gas at the time of growth.

To avoid such a situation, carrier gas during the growth of AlN in the low refractive index layer is converted into hydrogen so as to reduce or prevent In from being taken into In-doped MN. Alternatively, a mixed gas of hydrogen and nitrogen is used as the carrier gas, and the ratio of hydrogen is controlled so as to adjust the amount of In to be taken into In-doped AlN. Increasing the growth temperature of In-doped MN to be higher than the growth temperature of InGaN or incorporating hydrogen into carrier gas can supply In raw-material gas, which can improve the flatness AlN to AlN, and reduce the amount of In to be taken into In-doped AlN. For example, even if the ratio of the In raw material to be supplied to In-doped AlN is 10% or more, the amount of In doped in MN can be reduced to 1% or less, and even to the level of doping of impurity. This can improve the flatness of In-doped AlN, which is achieved by doping In, and enables the thermal conductivity to be equivalent to that of AlN.

Second Embodiment

Figure 3:
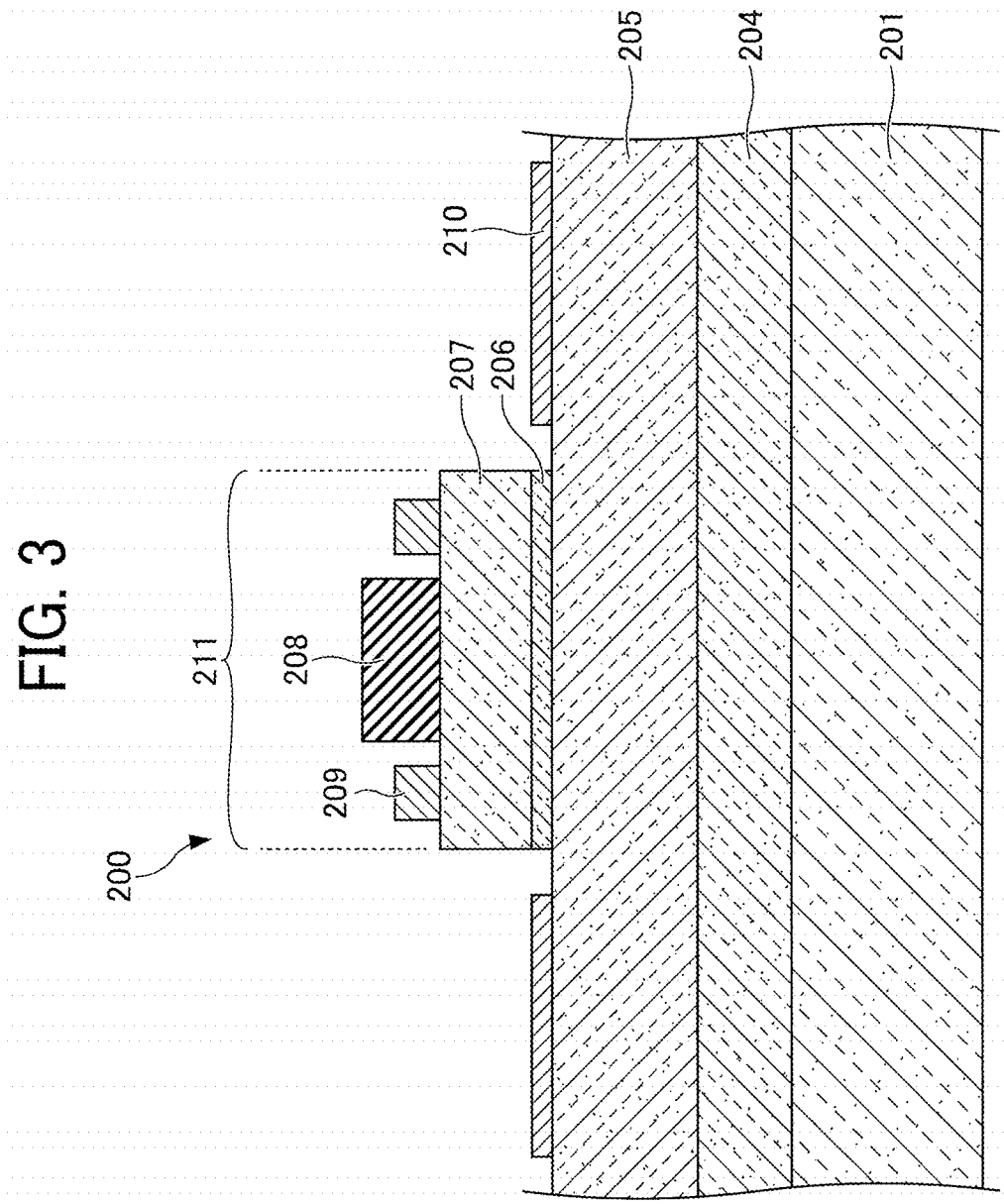
FIG. 3 is a cross-sectional view of a configuration of a surface-emitting laser according to a second embodiment.

Next, a surface emitting laser according to the second embodiment is described with reference to FIG. 3. FIG. 3 is a cross-sectional view of a configuration of a surface-emitting laser 200 according to the present embodiment.

As illustrated in FIG. 3, the surface-emitting laser 200 includes a first reflecting layer 204, a first semiconductor layer 205, an active layer 206, a second semiconductor layer 207, and a second reflecting layer 208. The surface-emitting lasers 200 emits laser beams from both sides, the first reflecting layer 204 and the second reflecting layer 208, and any of these emitted laser beams are available.

The first reflecting layer 204 includes the reflector 100 according to the first embodiment or the reflector 109 according to the tenth embodiment. The first reflecting layer 204 is on a substrate including GaN. The first semiconductor layer 205 is formed on the first reflecting layer 204.

A mesa structure 211, a stacked structure including the active layer 206 and the second semiconductor layer 207, is on the first semiconductor layer 205 to separate the elements from each other. The second reflecting layer 208 is on the second semiconductor layer 207.

A first electrode 209 is on the second semiconductor layer 207, and a second electrode 210 is around the mesa structure 211 on the first semiconductor layer 205. In FIG. 3, the mesa structure 211 including the active layer 206 at the bottom is illustrated. In some cases, a mesa structure might be difficult to form with the active layer 206 at the bottom because of its manufacturing process. In such a case, the mesa structure 211 that includes part of the first semiconductor layer 205 may be formed.

The first semiconductor layer 205 is a semiconductor layer including GaN, AlGaN, or InGaN. The conductive type includes n type and p type, and the n type is preferable from the viewpoint of resistivity. The n type is doped with Si or Ge as impurity, and the P type is doped with Mg.

If the film thickness is too low, the resistance increases, and this hampers the carrier injection from the second electrode 210 to the active layer 206. To above such a situation, the film thickness is preferably 1 µm or more. However, if the film thickness is increased, the length of a resonator formed between the first reflecting layer 204 and the second reflecting layer 208 becomes longer, and the diffraction loss of light may increase. In view of this issue, the film thickness is preferably 2 µm or less.

The active layer 206 constitutes a mesa structure on the first semiconductor layer 205. The active layer 206 is preferably formed in a multiple quantum well structure such as InGaN/GaN or InGaN/InGaN in order to confine the carriers injected from the first semiconductor layer 205 and the second semiconductor layer 207 and improve the light emitting efficiency.

The second semiconductor layer 207 has a conductive type of GaN, AlGaN, or InGaN, which is opposite to the conductive type of the first semiconductor layer 205. When the first semiconductor layer 205 is an n-type layer, the second semiconductor layer 207 is a p-type layer. When the first semiconductor layer 205 is a p-type layer, the second semiconductor layer 207 is an n-type layer.

The second reflecting layer 208 is a multilayer reflecting mirror including a semiconductor, a dielectric, or a combination of a semiconductor and a dielectric. A second reflecting layer 208 that includes a semiconductor may have the same structure as the first reflecting layer 204, or another structure of AlInN/GaN that is different from the first reflecting surface 204. With the reflector 100 applied to each of the first reflecting layer 204 and the second reflecting layer 208, the heat generated in the active layer 206 can be effectively released from the front side (i.e., the upper side opposite to the substrate 201) and the substrate 201 side of the surface-emitting lasers 200.

In some example, the first reflecting layer 204 is doped to have electrical conductivity, which is the same type conductivity as the first semiconductor layer 205. In FIG. 3, the second electrode 210 is formed on the first semiconductor layer 205. In some examples, the first reflecting layer 204 is conductive, and a second electrode is formed on the back side of the substrate 201.

Examples of the dielectric material used for the second reflecting layer 208 include, but not limited to, SiN, $SiO_2$, $Ta_2O_5$, and $Nb_2O_5$. The material can be selected according to its intended purpose.

The dielectric has a refractive index difference greater than the semiconductor, and the reflectivity of the dielectric significantly increases and decreases in each pair. To deal with such a situation, the reflectivity of the second reflecting layer 208 is reduced to be lower than the first reflecting layer 204, and properly adjusted to enable output of light through the second reflecting layer 208. Such an adjustment method includes the following: a method that involves combining any of plural pairs having different refractive index differences to obtain any desired reflectivity; a method that involves increasing and reducing from $\lambda/4$ optical film thicknesses of a low refractive index layer and a high refractive index layer; and a method that involves adding another layer having a different refractive index in addition to a low refractive index layer and a high refractive index layer.

A dielectric, which has a thermal conductivity lower than a semiconductor, less likely dissipates the heat toward the second reflecting layer 208. With the reflector 100 incorporated in the first reflecting layer 204, however, the heat generated from the active layer 206 can be dissipated toward the substrate 201, and thus heat generation of the surface-emitting lasers 200 is prevented.

The surface-emitting lasers 200 may have another structure according to the intended use: a structure with an opening, an insulator film including $SiO_2$, and a transparent electrode including ITO; or a current constriction structure obtained by selectively forming a tunnel junction on the second semiconductor layer 207 and covering them with a semiconductor layer of the same conductive type as the first semiconductor layer 205.

Further, at least one of the first electrode 209 and the second electrode 210 is formed from a material capable of forming ohmic contact. Examples of such a material used to form at least one of the first electrode 209 and the second electrode 210 include Ni/Au for contact with p-GaN, and Ti/Al for contact with n-GaN.

The configuration with the first reflecting layer 204 including the reflector 100 enables a surface-emitting laser that features high productivity and high heat dissipation.

Further, incorporating the first reflecting layer 204 with high heat dissipation can effectively release the heat generated in the active layer 206 during the current injection. This improves the light emitting characteristics of the surface-emitting lasers 200. Power consumption of the surface-emitting lasers 200 can be reduced by confining the light and the current in a narrower region and driving the surface emitting laser 200 with low currents. Further, the light-emission output power of the surface-emitting lasers 200 can be improved by driving the surface-emitting lasers 200 with high currents.

Third Embodiment

Figure 4:
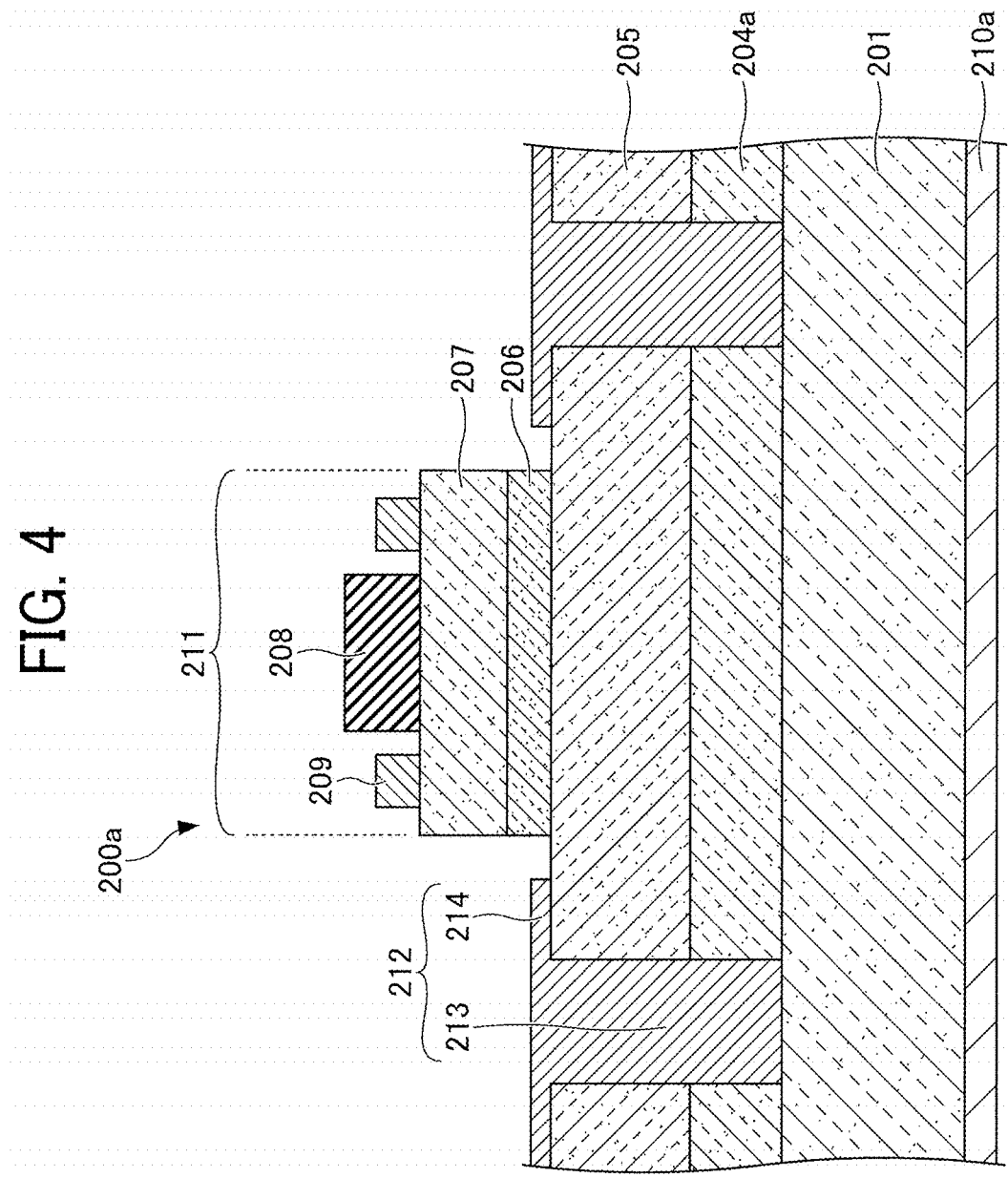
FIG. 4 is a cross-sectional view of a configuration of a surface-emitting laser according to a third embodiment.

Next, a surface-emitting laser according to the third embodiment is described with reference to FIG. 4. The description of the same elements as those in the second embodiment are omitted as appropriate, and different elements are described. FIG. 4 is a cross-sectional view of a configuration of a surface-emitting lasers 200a according to the present embodiment.

As illustrated in FIG. 4, the surface-emitting laser 200a includes a first reflecting layer 204a and a second electrode 210a. The first reflecting layer 204a includes a reflector 100 or a reflector 109. The first reflecting layer 204a is on a substrate 201 including GaN. The second electrode 210a is provided on the surface of the substrate 201 opposite to the first reflecting layer 204a.

A Ga-doped AlN layer or an In-doped AlN layer used for the low refractive index layer of the first reflecting layer 204 has a high electrical resistance. Doping impurity such as Si to render the layer conductive still fails to reduce the resistance to a desired degree. To deal with such an issue, in the present embodiment, a conductive part 212 is provided in the first reflecting layer 204a to electrically connect the first semiconductor layer 205 with the substrate 201.

The conductive part 212 includes a through hole 213 that penetrates through the first reflecting layer 204a and a current-carrying part 214 provided to make the through hole 213 filled with the current-carrying part 214. The current-carrying part 214 is formed from a conductive material such as a semiconductor or metal. The current-carrying part 214 has one end electrically connected with the first semiconductor layer 205 and the other end electrically connected with the substrate 201. The electrical connection between the first semiconductor layer 205 and the substrate 201 via the current-carrying part 214 allows injection of carriers from the substrate 201 side to the mesa structure 211 through the first semiconductor layer 205.

For the current-carrying part 214 formed from a semiconductor material, a material of the same conductive type as the first semiconductor layer 205 is used. Examples of such a material include GaN, AlGaN, and InGaN. For the current-carrying part 214 formed from a metallic material, a material capable of forming ohmic contact with the substrate 201 or the first semiconductor layer 205 is preferable. Examples of such a material includes Ti/Al, Ti/Au, and Cr/Au.

Depending on the dimension of the surface-emitting lasers 200a, the contact area of the substrate 201 and the current-carrying part 214 is not sufficiently obtained to achieve intended performance, and contact resistance might increase. In this case, a semiconductor layer doped with impurities of $1 \times 10^{18}$ cm$^{-3}$ or more is provided between the first reflecting layer 204a and the substrate 201 to reduce the contact resistance. In the example of FIG. 4, the current-carrying part 214 is provided to make the through hole 213 completely filled with the current-carrying part 214. This is only one example. Notably, the through hole 213 is not to be completely filled with the current-carrying part 214 unless the element resistance is affected. The current-carrying part 214 may be provided at least part of the interior of the through hole 213.

The surface-emitting laser 200a according to the present embodiment includes a conductive part 212 electrically connecting the first semiconductor layer 205 with the substrate 201, which constitutes the first reflecting layer 204. This configuration achieves electrical conductivity between the first semiconductor layer 205 and the substrate 201 even when the electrical resistance of the Ga-doped AlN layer or the In-doped AlN layer is high. This allows confinement of light and currents into a much narrower area, and thus achieves a low power consuming surface-emitting laser, which is operatable at a low current or a high-power surface-emitting laser, which is operatable at a high current.

Fourth Embodiment

Figure 5:
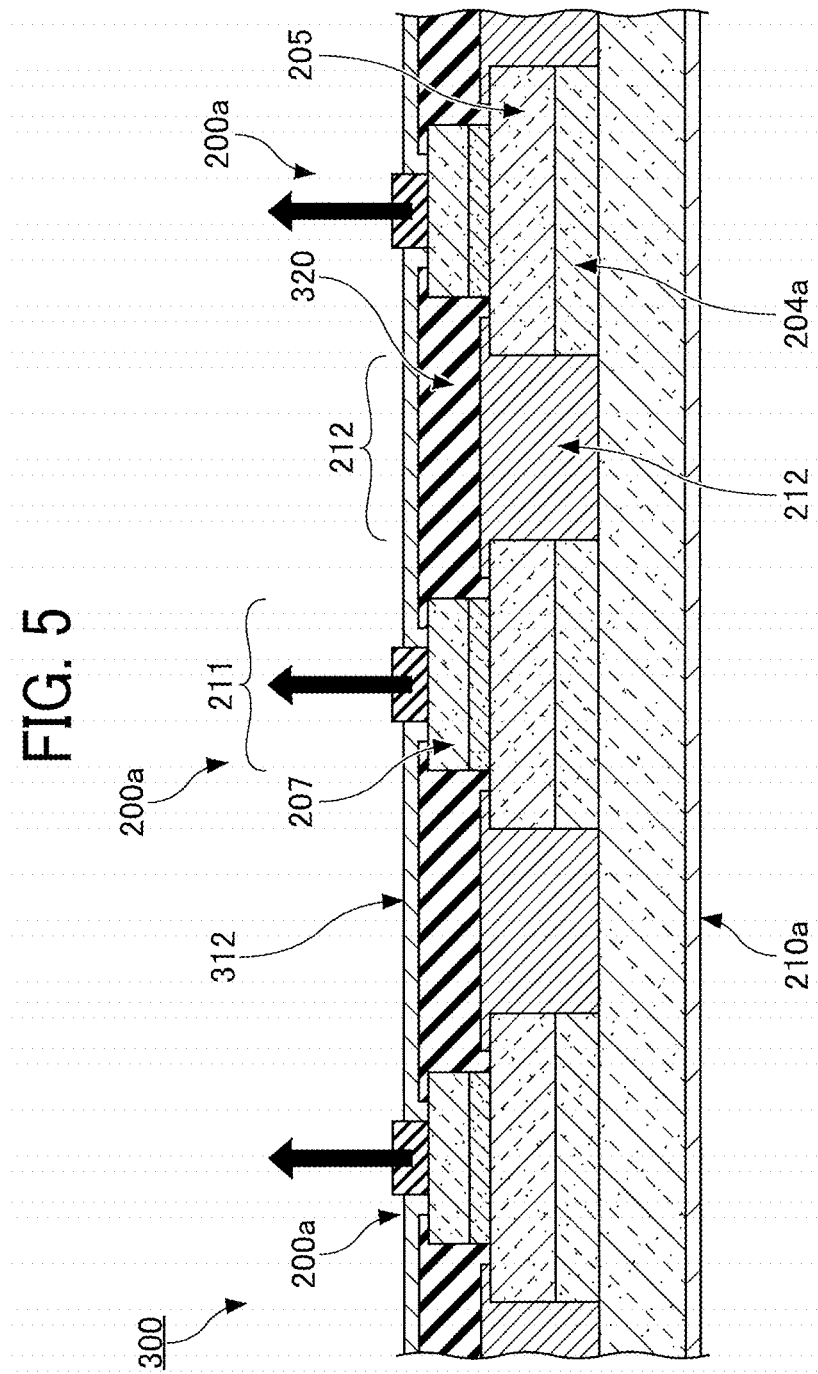
FIG. 5 is a cross-sectional view of a configuration of a two-dimensional array light source according to a fourth embodiment.

Next, a two-dimensional array light source according to a fourth embodiment is described with reference to FIG. 5. FIG. 5 is a cross-sectional view of a two-dimensional array light source 300 according to the present embodiment to describe an example of the configuration of the two-dimensional array light source 300. The two-dimensional array light source 300 is an example of a light source.

The two-dimensional array light source 300 has multiple surface-emitting lasers 200a arranged in array in a plane. Unlike the third embodiment including one surface-emitting lasers 200a with one first electrode 209, the present embodiment includes a plurality of surface-emitting lasers 200a with one or more common electrodes 312.

The two-dimensional array light source 300 includes an insulating layer 320 that electrically insulates the first semiconductor layer 205 and the conductive part 212 from the common electrode 312. The insulating layer 320 covers the first semiconductor layer 205, a conductive part 212, and the side wall of the mesa structure 211. Examples of the material of the insulating layer 320 include inorganic materials such as $SiO_2$ and SiN and organic materials such as polyimide. Although one common electrode 312 is illustrated in FIG. 5, in some examples, two or more common electrodes are formed in each region intended to emit light in the plane according to the intended use.

Example layouts of the two-dimensional array light source 300 are described with reference to FIGS. 6 to 9. FIGS. 6 to 9 are illustrations of some example layouts of the two-dimensional array light source 300. The example layouts particularly indicate the arrangement of mesa structures 211 and conductive parts 212.

Figure 6:
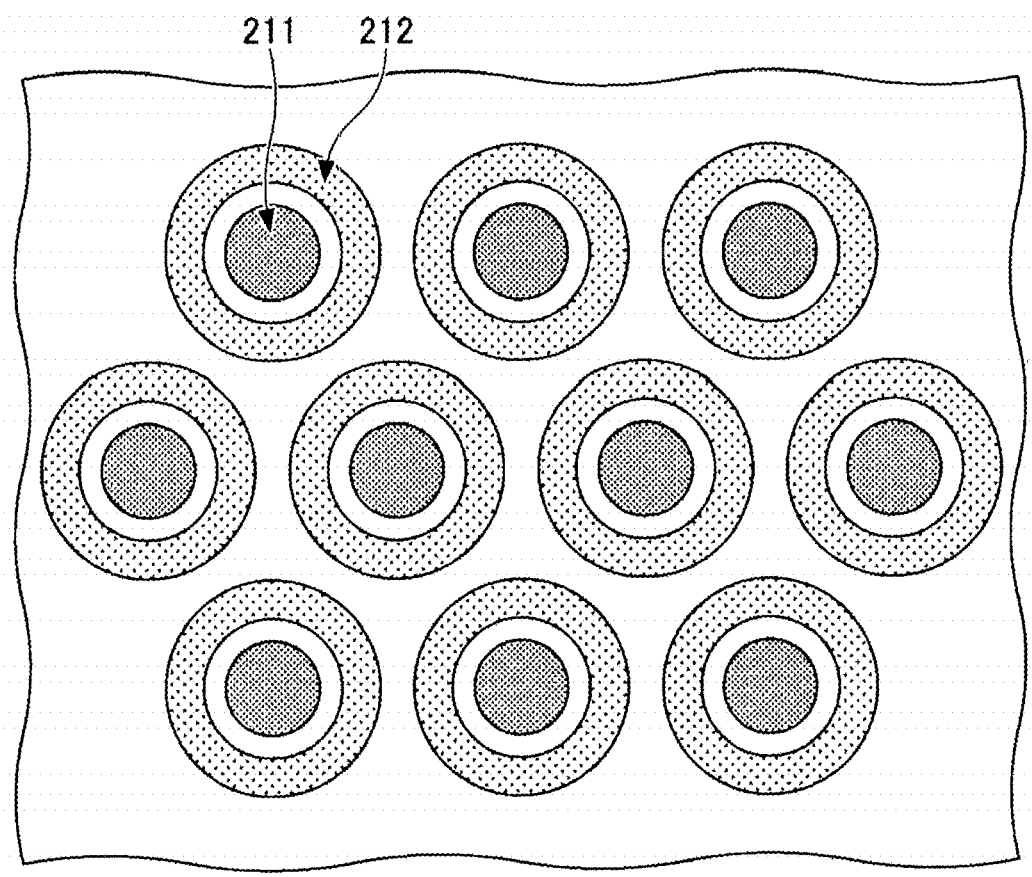
FIG. 6 is a plan view of a first example layout of the two-dimensional array light source according to an embodiment.

In the example of FIG. 6, multiple mesa structures 211 are arranged in an equilateral triangle grid pattern, and each mesa structure 211 is surrounded by a conductive part 212 separate from the corresponding mesa structure 211.

Figure 7:
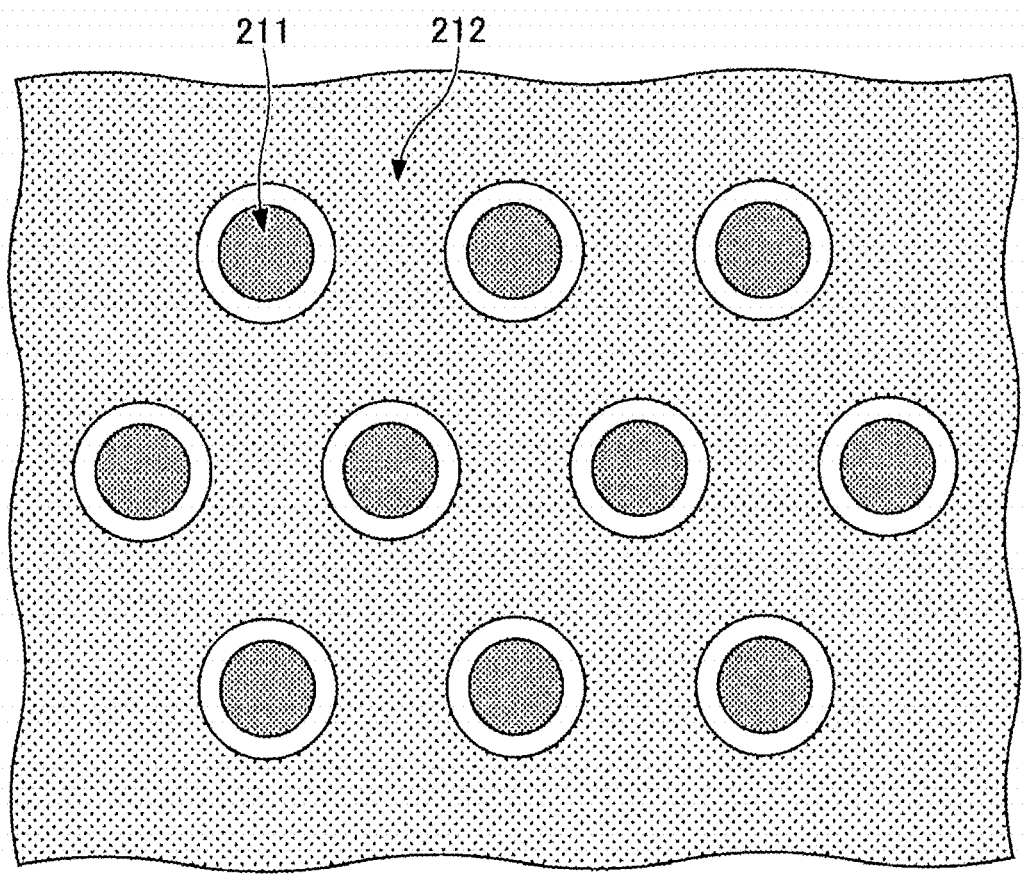
FIG. 7 is a plan view of a second example layout of the two-dimensional array light source according to an embodiment.

In the example of FIG. 7, multiple mesa structures 211 are arranged in an equilateral triangle grid pattern. The multiple mesa structures 211 are surrounded by a single conductive part 212. In other words, the conductive part 212 is shared by the multiple mesa structures 211. Further, in other words, the conductive part 212 is shared by the multiple surface-emitting lasers 200a.

Figure 8:
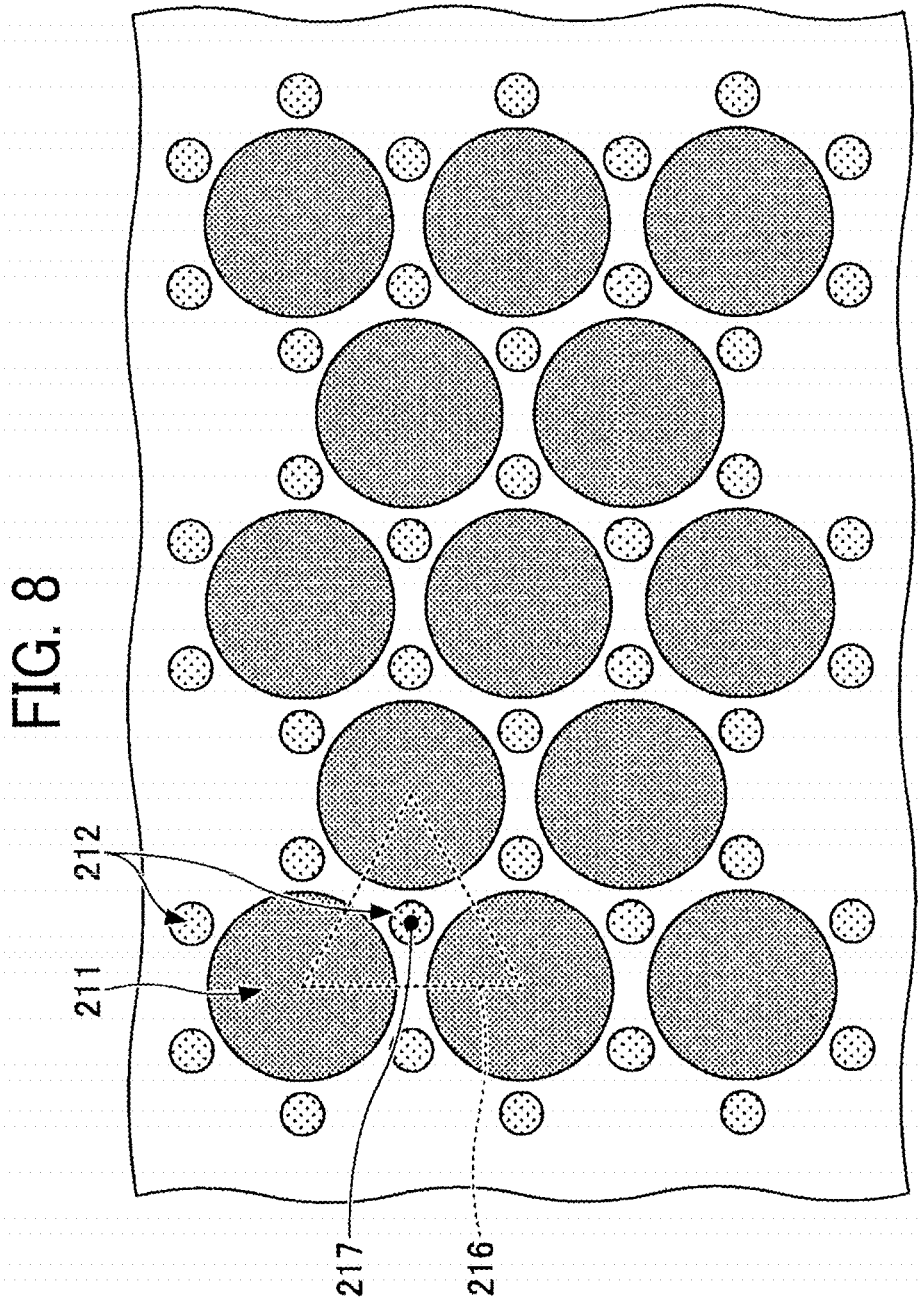
FIG. 8 is a plan view of a third example layout of the two-dimensional array light source according to an embodiment.

In the example of FIG. 8, multiple mesa structures 211 are arranged in an equilateral triangle grid pattern. Each of the multiple mesa structure 211 is surrounded by plural conductive parts 212 (e.g., six conductive parts 212 in FIG. 8), each of which is shared by at least two mesa structures 211 of all the multiple mesa structures.

Further, one conductive part 212 is provided at the center of gravity of adjacent mesa structures 211 that defines grid points. The grid points defined by three mesa structures 211 are illustrated by a triangle indicated by broken line in FIG. 8. In other words, one conductive part 212 is disposed at the center of gravity 217 of the grid points 216.

The example of FIG. 8 enables a structure with a higher density of surface-emitting lasers 200a than the examples in FIGS. 6 and 7.

Figure 9:
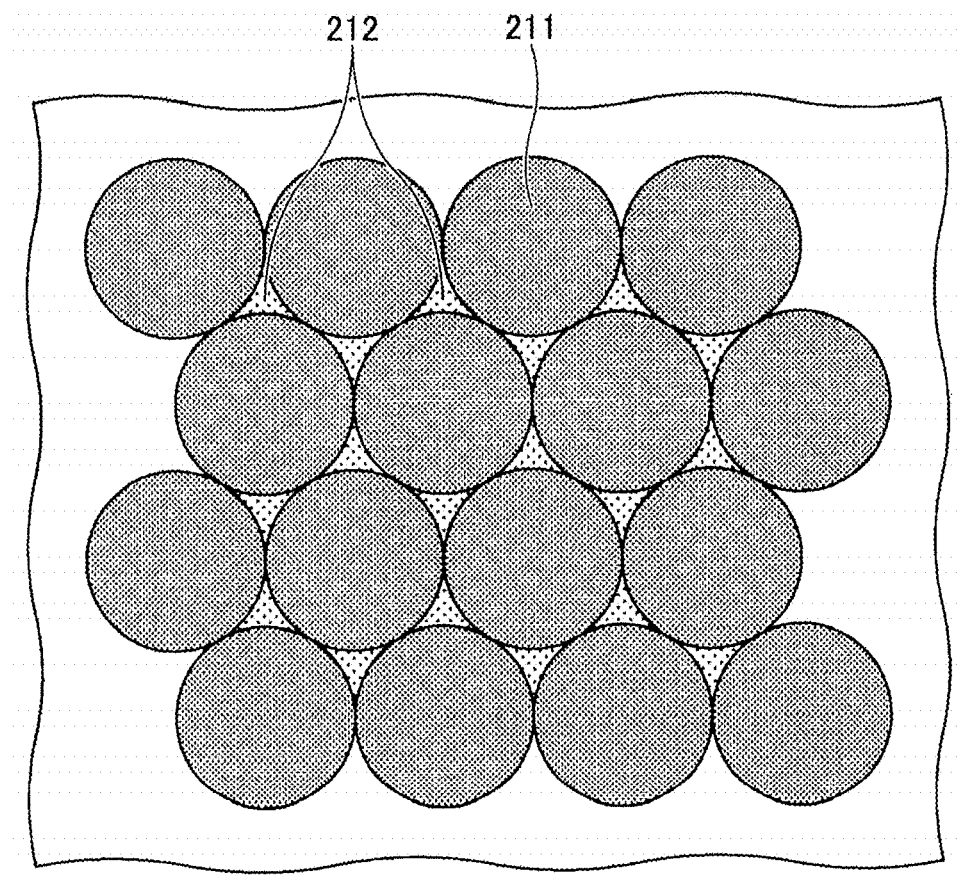
FIG. 9 is a plan view of a fourth example layout of the two-dimensional array light source according to an embodiment.

In the example of FIG. 9, the mesa structures 211 are tangent to each other in the structure of FIG. 8. This configuration enables much higher density arrangement of the mesa structures 211, and thus enables a much higher density of the surface-emitting lasers 200a. All the areas surrounded by the mesa structures 211 may be conductive parts 212. Although FIG. 9 indicates an example in which adjacent mesa structures 211 are in contact with each other, in some examples, the adjacent mesa structures 211 are arranged with a gap therebetween. In other words, the adjacent mesa structures 211 are be arranged close to each other.

In the examples of FIGS. 6 to 9, the mesa structures 211 are circle as a planar shape, and in the examples of FIGS. 6 to 8, the conductive parts 212 are also circle as a planar shape. Alternatively, the mesa structures 211 and the conductive parts 212 have a polygonal shape such as a rectangle or a triangle, or any other shape other than a circle and such a polygonal shape. For other examples other than the triangle grid pattern, the mesa structures 211 may be arranged in a rectangular grid pattern, a honey-comb pattern, or another pattern.

In the two-dimensional array light source 300 according to the present embodiment, carriers are injected into the multiple surface-emitting lasers 200a upon voltage application between the common electrode 312 and the second electrode 210a, and the multiple surface-emitting lasers 200a each emit light. The two-dimensional array light source 300 with high heat dissipation properties allows a short distance between the mesa structures 211, and enables high-density arrangement of the surface-emitting lasers 200a.

Although the two-dimensional array light source 300 according to the fourth embodiment includes the surface-emitting lasers 200a according to the third embodiment, in some other examples, the two-dimensional array light source 300 includes the surface-emitting lasers 200 according to the second embodiment. This eliminates the need of the conductive part 212 and enables sharing of the second electrode 210 on the first semiconductor layer 205 between the multiple surface-emitting lasers 200. The second electrode 210 is desired to be shared by the multiple surface-emitting lasers 200 unless the surface-emitting lasers 200 have such a layout in FIG. 9 that the mesa structures 211 are adjacent to each other.

Fifth Embodiment

Figure 10:
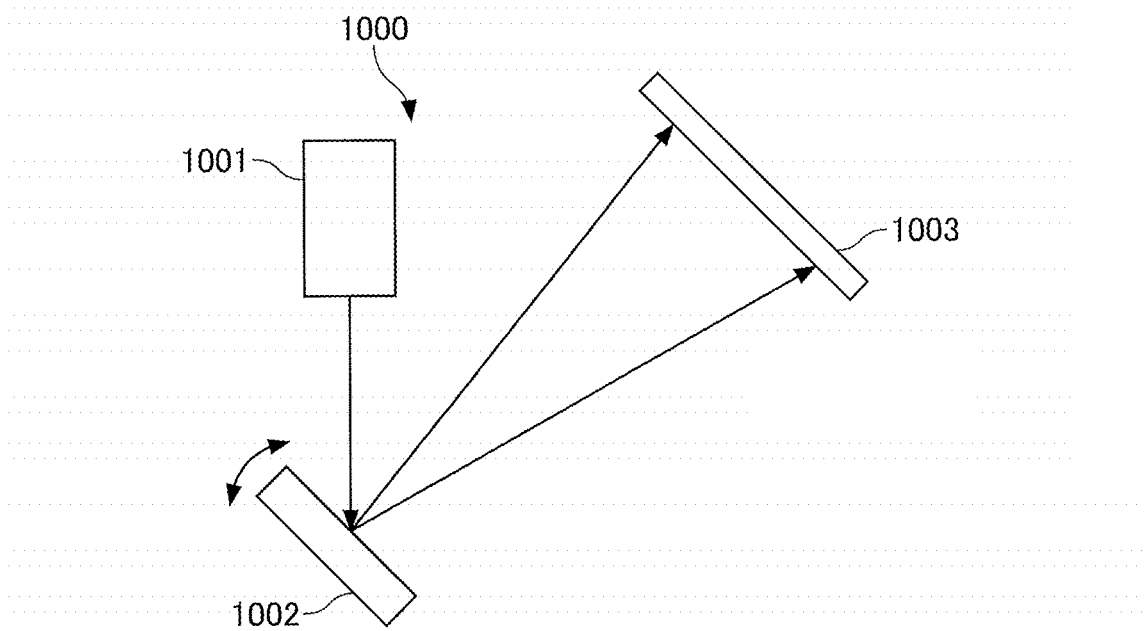
FIG. 10 is an illustration of a configuration of a projection device according to a fifth embodiment.

Next, a projection device is described according to the fifth embodiment with reference to FIG. 10. FIG. 10 is an illustration of a configuration of a projection device 1000 according to the sixth embodiment. The projection device 1000 can draw an image by scanning with its laser beam.

As illustrated in FIG. 10, the projection device 1000 includes a light source 1001 and an optical scanner 1002. The light source 1001 includes at least one selected from the group consisting of of the surface emitting laser 200 according to the second embodiment, the surface emitting laser 200a according to the third embodiment, or the two-dimensional array light source 300 according to the fourth embodiment.

For the light source 1001 with one of the surface-emitting lasers 200a and the two-dimensional array light source 300, the projection device 1000 projects an image of a single color onto a target object 1003. For the light source 1001 with a plurality of the surface-emitting lasers 200a or the two-dimensional array light source 300, the projection device 1000 emits light coaxially with the optical axis of each surface-emitting laser, and projects an image of multiple colors onto a target object 1003 by changing an oscillation wavelength of each surface-emitting laser.

The optical scanner 1002 includes an element that scans the target object 1003 with a laser beam emitted from the light source 1001 so as to project an image onto the target object 1003. Such an element is, for example, a biaxially movable MEMS mirror or a unit including two uniaxially movable MEMS mirrors. The optical scanner 1002 is an example of an optical element that adjusts the direction of travel of the laser beam emitted from the light source 1001.

During the scanning by the optical scanner 1002, the optical scanner 1002 irradiates the target object 1003 with the laser beam while modulating its intensity, to generate an image. Thus, the optical scanner generates an image directly on the target object 1003.

A light source 1001 with the surface-emitting lasers 200 can output a laser beam with power of approximately μW order to several mW. The light source 1001 with such a power can draw an image in an extremely small area. Such a projection device 1000 can be used, for example, as a retinal display that draws directly on the retina with a laser beam. The surface-emitting laser according to the present embodiment, which is low power consuming and can reduce a battery capacity, achieves a compact lightweight retinal display.

A light source 1001 with an array light source can output a laser beam with power of nW order to kW order. The light source 1001 with such a power can draw an image in a large area. Such a projection device 1000 can be used, for example, as projector. The present embodiment enables a simple-structured optical system with a high-density integrated two-dimensional array light source, and thus achieves a compact projector.

Sixth Embodiment

Figure 11:
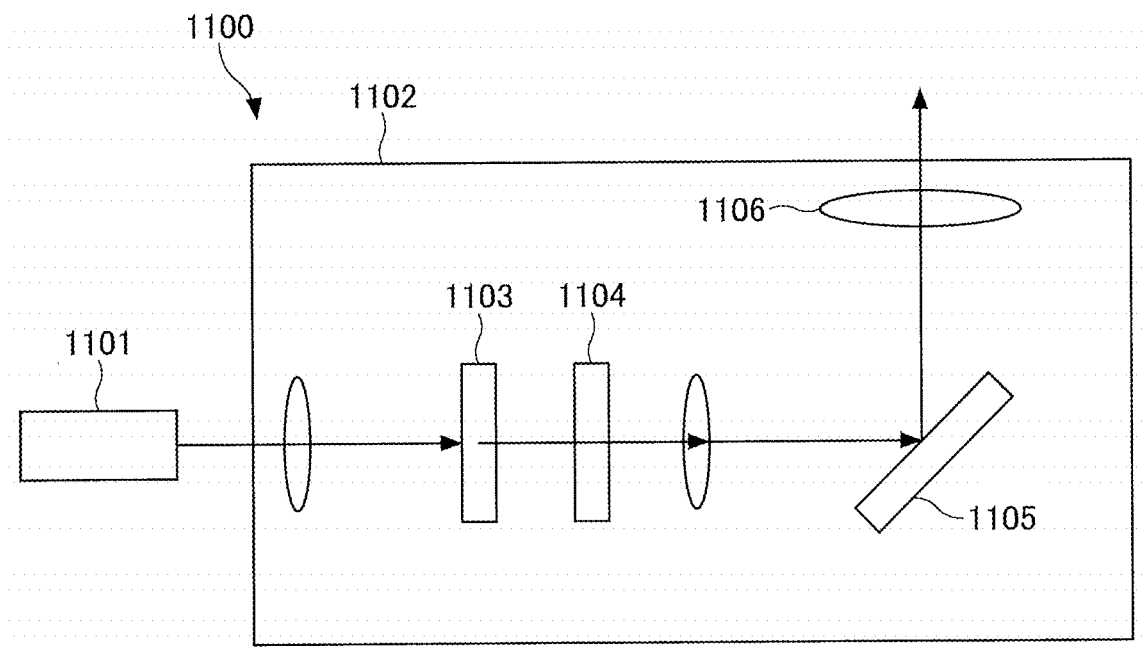
FIG. 11 is an illustration of a configuration of a projection device according to a sixth embodiment.

Next, a projection device is described according to the sixth embodiment with reference to FIG. 11. FIG. 11 is an illustration of a configuration of a projection device 1100 according to the sixth embodiment. The projection device 1100 includes a light source 1101 and a projection optics 1102. The light source 1101 includes a two-dimensional array light source 300 according to the fourth embodiment.

The projection optics 1102 includes at least a fluorescent member 1103, a filter 1104, and an image generator 1105. As appropriate, the projection optics 1102 further includes a lens such as a projector lens 1106 and a mirror.

The fluorescent member 1103 produces white light when excited by a portion of light that is emitted from the light source 1101 and incident on the projection optics 1102. The fluorescent member 1103 uses a fluorescent member that produces yellow light when the light source 1101 emits blue light, and uses a fluorescent member that produces white light when the light source 1101 emits ultraviolet light.

The filter 1104 separates white light into colors, and includes a movable unit. The filter 1104 is, for example, a color wheel that transmits red, blue, and green colored light.

The image generator 1105 generates an image with light transmitted through the filter 1104. The image generator 1105 is, for example, a MEMS device with micro mirrors arranged in two-dimensional array or a reflective liquid crystal element.

The projector lens 1106 magnifies the image generated by the image generator 1105 to a desired magnification and projects it onto an object. The projection optics 1102 is an example of an optical element that adjusts the wavelength and the direction of travel of the laser beam emitted from the light source 1101.

Instead of the filter 1104, the projection optics 1102 may include at least one of a prism and a dichroic mirror. The projection optics 1102 with at least one of a prism and a dichroic mirror can split light into light beams of different colors (e.g., red, green, and blue). Then, three image generators in the projection optics 1102 generate images for the colors, and the prism combines the light beams forming the images.

The projection device according to the present embodiment can be used as a projector. The present embodiment enables a simple-structured optical system with a high-density integrated two-dimensional array light source 300, and thus achieves a compact projector.

Seventh Embodiment

Figure 12:
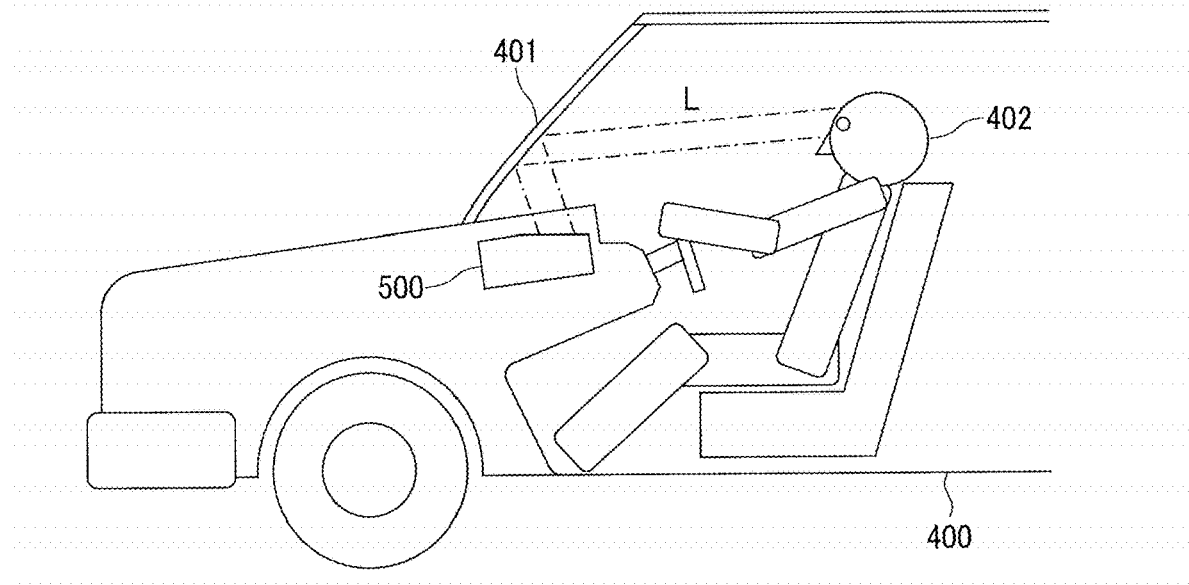
FIG. 12 is an illustration of, a configuration of a vehicle equipped with a heads-up display (HUD) according to a seventh embodiment.
Figure 13:
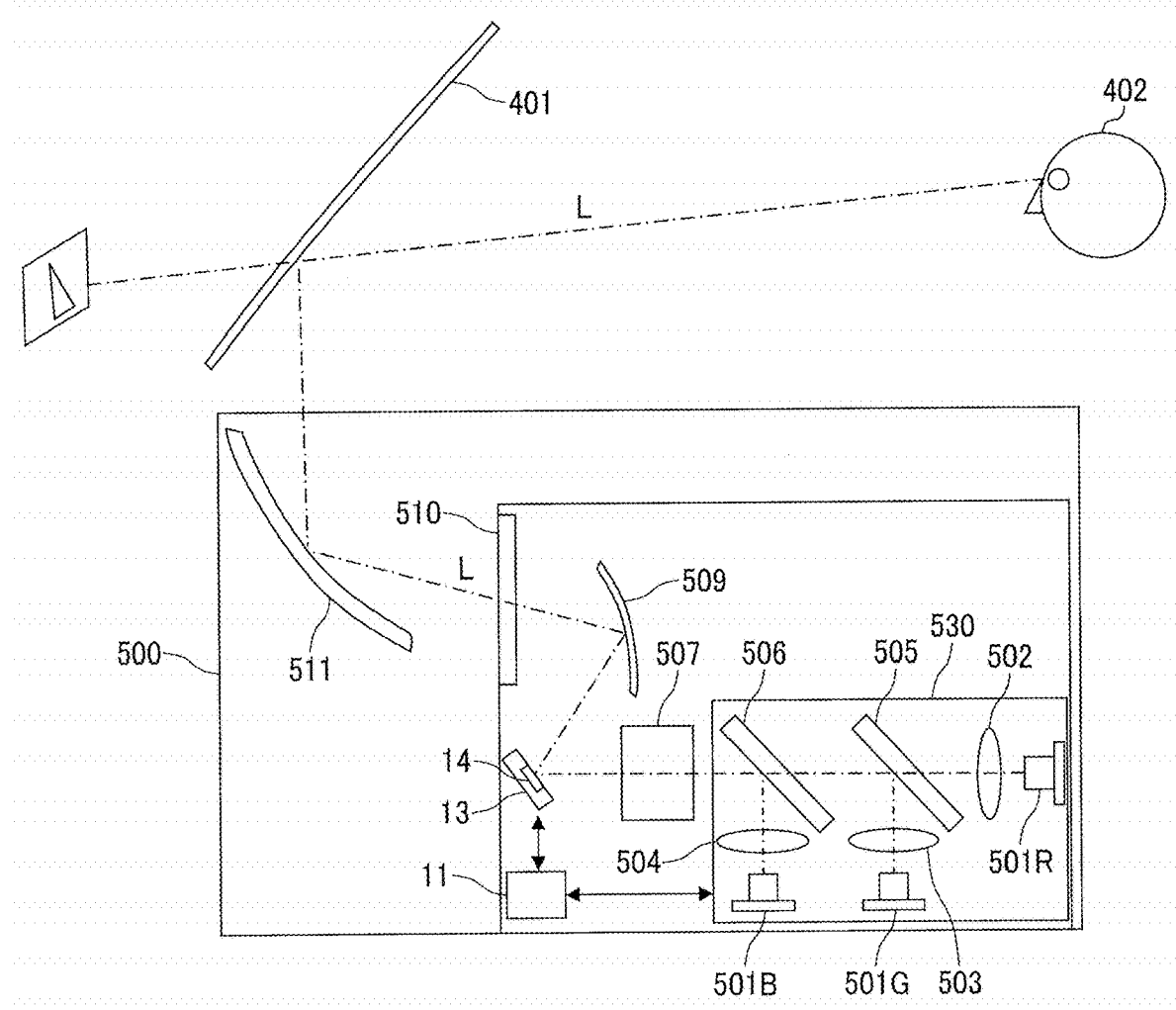
FIG. 13 is an illustration of a configuration of the HUD according to the seventh embodiment.

Next, a heads-up display (HUD) is described according to the seventh embodiment with reference to FIGS. 12 and 13. FIG. 12 is an illustration of a configuration of a vehicle 400 equipped with the HUD 500, according to the seventh embodiment. FIG. 13 is an illustration of a configuration of the HUD 500.

The HUD 500 as an example of a display device projects light forming an image to a windshield 401 of the vehicle 400 and displays a virtual image to overlap the foreground of the vehicle 400.

As illustrated in FIG. 12, the HUD 500 is disposed near a windshield 401 of a vehicle 400. Light L, which has been projected from the HUD 500, is reflected by the windshield 401, and the reflected light is directed to an observer (i.e., a driver 402, or a user). The light L reaching the eyes of the driver 402 enables the driver 402 to visually recognize a virtual image that is an image projected by the HUD 500. Notably, in some other examples, a combiner is disposed on the inner wall of the windshield 401, and the user visually recognizes a virtual image formed by light L projected from the HUD 500 and reflected by the combiner.

As illustrated in FIG. 13, the HUD 500 emits three-color laser beams from red, green, and blue laser sources 501R, 501G, and 501B, respectively. The laser source 501R, which emits a red laser beam, includes at least one selected from the group consisting of a surface-emitting laser 200, a surface-emitting lasers 200a, or a two-dimensional array light source 300. The laser source 501G, which emits a green laser beam, includes at least one selected from the group consisting of the surface-emitting laser 200, the surface-emitting lasers 200a, or the two-dimensional array light source 300. The laser source 501B, which emits a blue laser beam, includes at least one selected from the group consisting of the surface-emitting laser 200, the surface-emitting lasers 200a, or the two-dimensional array light source 300.

The emitted laser beams pass through an incident optical system and then are deflected by the movable device 13 with the reflecting surface 14. The incident optical system includes collimator lenses 502, 503, and 504 respectively provided for the laser sources 501R, 501G, and 501B, two dichroic mirrors 505 and 506, and a light-intensity adjuster 507.

Examples of the movable device 13 include a biaxially movable micro-electromechanical systems (MEMS) mirror or a unit including two uniaxially movable MEMS mirrors.

The deflected laser beams pass through a projection optical system including a free-form surface mirror 509, an intermediate screen 510, and a projector mirror 511, and are projected onto the windshield 401. In the HUD 500, the laser sources 501R, 501G, and 501B, the collimator lenses 502, 503, and 504, and the dichroic mirrors 505 and 506 are unitized as a light source unit 530 in an optical housing.

The HUD 500 projects an intermediate image that is displayed on the intermediate screen 510 onto the windshield 401 of the vehicle 400, allowing the driver 402 to visually recognize the intermediate image as a virtual image.

Laser beams of the respective colors emitted from the laser sources 501R, 501G, and 501B are approximately collimated by the collimator lenses 502, 503, and 504, and are combined by two dichroic mirrors 505 and 506, which constitute a combiner. The light intensity of the combined laser beams is adjusted by the light-intensity adjuster 507, before being deflected for two-dimensionally scanning by the movable device 13 including the reflecting surface 14. The light L being deflected for two-dimensional scanning by the movable device 13 is reflected by the free-form surface mirror 509 and has its distortion corrected, thus being condensed on the intermediate screen 510. The intermediate screen 510 includes a microlens array in which microlenses are two-dimensionally arranged, and enlarges the projection light L incident on the intermediate screen 510 in units of microlens.

The movable device 13 causes the reflecting surface 14 to biaxially reciprocate and two-dimensionally scan with the light L incident on the reflecting surface 14. The operation of the movable device 13 is controlled in synchronization with the light-emitting timings of the laser sources 501R, 501G, and 501B.

The present embodiment enables a simple-structured optical system with a high-density integrated surface-emitting laser or two-dimensional array light source, and thus achieves a compact HUD.

Notably, the HUD 500 may be incorporated in, not only a vehicle 400 but also a mobile object, including an aircraft, a ship, or a moving robot, and an immobile object such as an operation robot that operates a driving target such as a manipulator without moving from the installed location. Such a HUD can exhibit the same advantageous effect.

Eighth Embodiment

Figure 14:
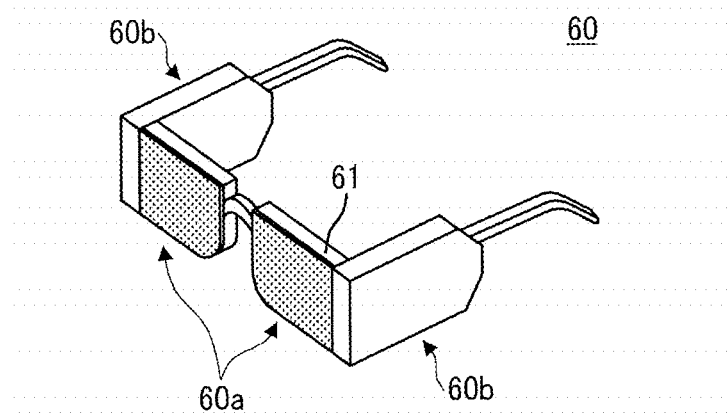
FIG. 14 is an illustration of a configuration of a head mounted display (HMD) according to an eighth embodiment.
Figure 15:
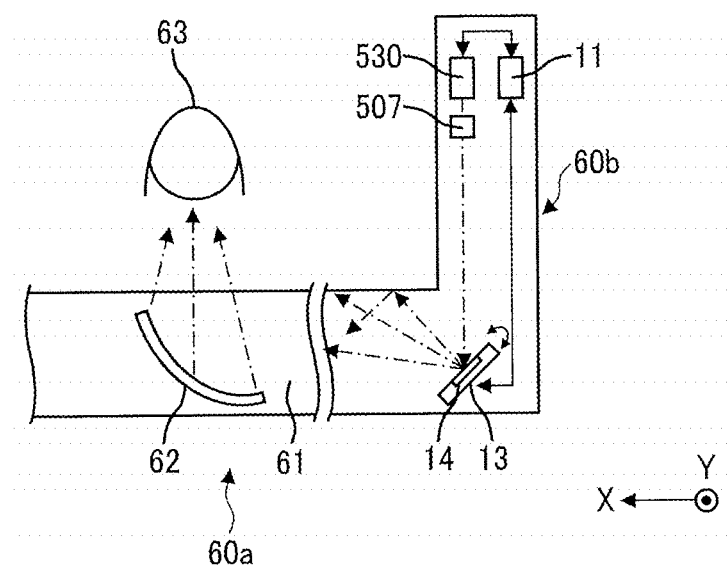
FIG. 15 is a cross-sectional view of a configuration of the HMD according to the eighth embodiment.

Next, a head-mounted display (HMD) according to the eighth embodiment is described with reference to FIGS. 14 and 15. FIG. 14 is a perspective view of a configuration of the HMD 60 according to the present embodiment. FIG. 15 is a cross-sectional view of the configuration of the HMD 60.

Note that the HMD 60 is an example of a head-mounted display device that can be mounted on a human head, and can be shaped like, for example, glasses.

In FIG. 14, the HMD 60 includes a pair of a front part 60a and a temple 60b provided substantially symmetrically on each of the left and right. The front parts 60a each have a light guide plate 61. An optical system, a controller, and another component are incorporated in the temple 60b.

FIG. 15 is a partial view of an example configuration of the HMD 60, according to the present embodiment. FIG. 15 illustrates a configuration for the left eye. The HMD 60 has the same configuration for the right eye.

The HMD 60 includes a controller 11, a light source unit 530, a light-intensity adjuster 507, a movable device 13 with a reflecting surface 14, a light guide plate 61, and a semi-reflective mirror 62.

The laser source 501R, which emits a red laser beam, includes at least one selected from the group consisting of a surface-emitting laser 200, a surface-emitting lasers 200a, or a two-dimensional array light source 300. The laser source 501G, which emits a green laser beam, includes at least one selected from the group consisting of the surface-emitting laser 200, the surface-emitting lasers 200a, or the two-dimensional array light source 300. The laser source 501B, which emits a blue laser beam, includes at least one selected from the group consisting of the surface-emitting laser 200, the surface-emitting lasers 200a, or the two-dimensional array light source 300.

The light source unit 530 according to the present embodiment includes the laser sources 501R, 501G, and 501B, the collimator lens 502, 503, and 504, and the dichroic mirrors 505 and 506, and these elements are combined as a single unit in an optical housing. In the light source unit 530, the laser beams of the RGB colors that are emitted from the laser sources 501R, 501G, and 501B are combined by the two dichroic mirrors 505 and 506. The combined parallel light is emitted from the light source unit 530.

The light intensity of the combined laser beams from the light source unit 530 is adjusted by the light-intensity adjuster 507. Then, the adjusted light is incident on the movable device 13. The movable device 13 moves the reflecting surface 14 in the XY-direction in accordance with the signal from the controller 11, and two-dimensionally scans with the light emitted from the light source unit 530. The movable device 13 is controlled in synchronization with the light-emitting timing of the laser sources 501R, 501G, and 501B.

The scanning light by the movable device 13 is incident on the light guide plate 61. The light guide plate 61 reflects the scanning light on the inner wall and guides the scanning light to the semi-reflective mirror 62. The light guide plate 61 is formed from a material such as a resin having transparency at the wavelength of the scanning light.

The semi-reflective mirror 62 reflects the light guided through the light guide plate 61 to the back side of the HMD 60, emitting the light in the direction to an eye of a wearer 63 of the HMD 60. The semi-reflective mirror 62 has, for example, a free-form surface shape. An image formed of the scanning light is reflected by the semi-reflective mirror 62, thus being formed on the retina of wearer 63. Alternatively, the reflection at the semi-reflective mirror 62 and the effect of the crystalline lenses of eyeballs causes the image of the scanning light to be formed on the retina of the wearer 63. Further, the reflection at the semi-reflective mirror 62 can correct spatial distortion of the image. The wearer 63 can visually identify an image formed by the light that is scanned in the XY direction.

The wearer 63 observes an image of external light superposed on the image of the scanning light because of the semi-reflective mirror 62. Alternatively, a mirror may be provided instead of the semi-reflective mirror 62 to block out external light and enable the wearer 63 to visually identify only the image of the scanning light.

The present embodiment enables a simple-structured optical system with a high-density integrated surface-emitting laser or two-dimensional array light source. Such a light source, which consumes less power than end face emitting laser, enables a compact and lightweight HDM.

Ninth Embodiment

Figure 16:
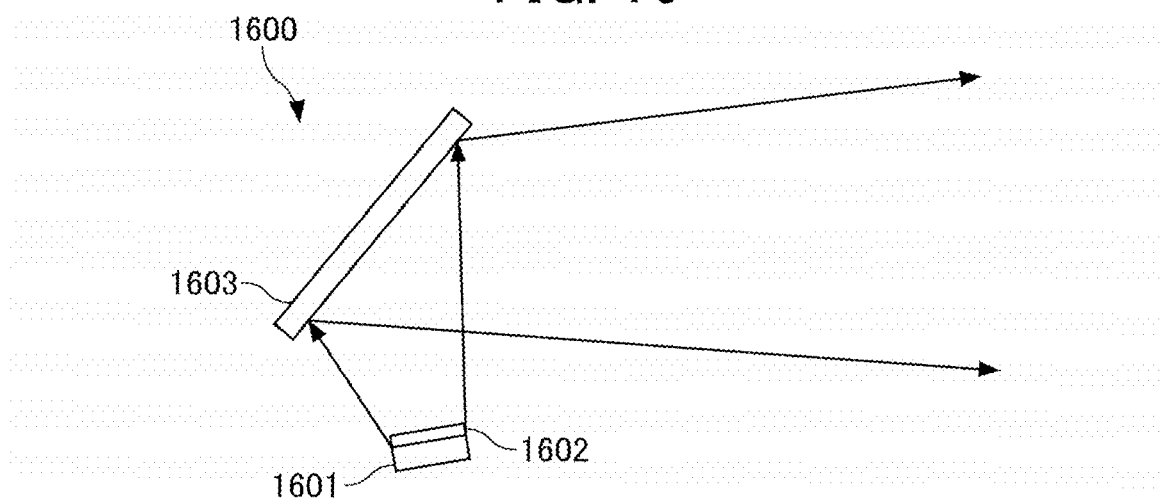
FIG. 16 is an illustration of a configuration of a light-emitting device according to a ninth embodiment.
Figure 17:
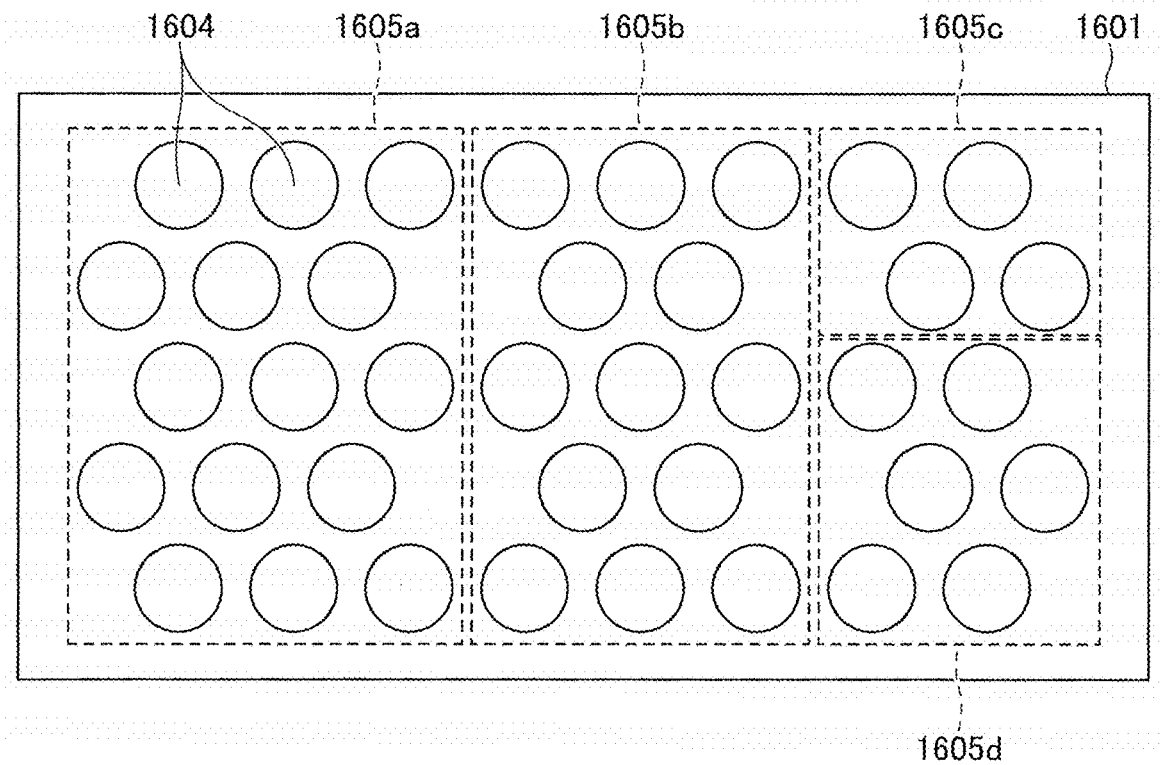
FIG. 17 is a layout diagram of a light source in a light-emitting device according to a ninth embodiment.

Next, the light-emitting device according to the ninth embodiment is described with reference to FIGS. 16 and 17. FIG. 16 is an illustration of a configuration of a light-emitting device 1600 according to the present embodiment. FIG. 17 is a layout diagram of a light source in a light-emitting device 1600.

The light-emitting device 1600 includes a light source 1601, a fluorescent member 1602, and a light-emitting member 1603. The light source 1601 uses, for example, the two-dimensional array light source 300 according to the fourth embodiment. Light emitted from the light source 1601 excites the fluorescent member 1602. The light-emitting member 1603 two-dimensionally diverges and emits the light emitted from the light source 1601 and the light emitted by the excitation of the fluorescent member 1602. The light-emitting member in FIG. 16 is, for example, a reflecting mirror.

The fluorescent member 1602 uses a fluorescent member that produces yellow light when the light source 1601 emits blue light, and uses a fluorescent member that produces white light when the light source 1601 emits ultraviolet light. The fluorescent member 1602 is an example of an optical element that adjusts the wavelength of the laser beam emitted from the light source 1601. Further, the light-emitting member 1603 is an example of an optical element that adjusts the traveling direction of the laser light that has been emitted from the light source 1601 and has its wavelength adjusted by the fluorescent member 1602.

A light source 1601 in FIG. 17 includes several tens of surface-emitting lasers and four common electrodes 1605 (1605a, 1605b, 1605c, and 1605d), which are simply described. The light source 1601 is a two-dimensional array light source having several thousands to tens of thousands of surface-emitting lasers 1604 arranged in array in a plane, including multiple common electrodes 1605. The arrangement and shape of the common electrodes 1605 in FIG. 17 is only one example, and the common electrodes 1605 can be arranged and shaped according to the intended use.

An upper common electrodes 1605 for applying voltage is selected from the multiple common electrodes 1605. This enables one light source 1601 to emit light to any desired place and space. The light-emitting device 1600, which is used as a vehicle-mounted headlight module with many upper common electrodes within one chip, is available as a high-power and compact adaptive front-lighting system. Further, using a surface emitting laser in such a light-emitting device 1600 enables a target spot to be irradiated with the emitted laser beam.

OTHER EXAMPLES

Next, some more examples of the above-described embodiments are described below.

Example 1

The following describes Examples 1. The Example 1 relates to a structure of a reflector with a reflection wavelength of 405 nm and its manufacturing method. The structure of a multilayered-film reflector according to the present example, which is the same as the reflector 100 in FIG. 1, is described with reference to FIG. 1.

In the present example, a GaN substrate is employed as the substrate 101. The low refractive index layer is a multilayer film including three GaN layers with a film thickness of 9 nm and two Ga-doped AlN layers with a film thickness of 5.2 nm and an atomic (Ga) concentration ratio of 0.03.

The high refractive index layer is $In_{0.05}Ga_{0.95}N$ having a film thickness of 43 nm, and the low refractive index layer and the high refractive index layer are alternately formed 44 cycles in total. When the optical film thickness is calculated with the refractive index of GaN being 2.45, the refractive index of Ga-doped AlN being 2.11, and the refractive index of $In_{0.05}Ga_{0.95}N$ being 2.60, the low refractive index layer has an optical film thickness of 67.6 nm, and the high refractive index layer has an optical film thickness of 111.8 nm. The high index layer is approximately 12% thicker than $\lambda/4$, and the low index layer is approximately 12% thinner than $\lambda/4$. In such a configuration, a ratio of the product of the strain and the film thickness of the Ga-doped AlN layer to the product of the strain and the film thickness of InGaN is 1.006, and the strain of the MN is equal to the strain of InGaN.

Next, a manufacturing method is described. A MOCVD device is used to manufacture nitride semiconductors. First, a GaN substrate is set in the reactor of the MOCVD device and heated. The temperature of the substrate is heated to 900° C., and a multilayered film of GaN layers 102b and Ga-doped AlN layers 102a is grown as the low refractive index layer 102. The Ga-doped MN layer has two layers with a thickness of 11 nm, and the GaN has three layers with a thickness of 7.5 nm. The GaN is grown first, and 2.5 cycles in total are grown.

The gas conditions of the Ga-doped MN layer are as follows: nitrogen atmosphere, a ratio of Ga supplied to TMA and TMI is 0.03, the sum of amounts of In supplied to TMA and TMI is 80 mol/min; NH3 is 40 mmol/min; and the V/III ratio is 500. The gas conditions of GaN are as follows: The TMG is 100 µmol/min; NH3 is 200 mmol/min; and the V/III ratio is 2000.

As the NH3 supply amount is changed by the growth of the GaN layer and the Ga-doped AlN layer, a growth interruption of 5 seconds is provided as a waiting time until the gas supply amount of NH3 stabilizes. Next, $In_{0.05}Ga_{0.95}N$ having a thickness of 43 nm is grown as the high refractive index layer 103 with the temperature maintained at 900° C. without a change in temperature.

The gas conditions are as follows: a nitrogen atmosphere, TMG of 100 µmol/mi, TMI of 70 µmol/min, NH3 of 200 mmol/min, and a V/III ratio of 1176. As the supply amounts of TMG and NH3 are the same as those of the GaN grown immediately before, the growth is not interrupted and the growth is continued.

After that, the multilayered film of the Ga-doped AlN layers and the GaN layers and the InGaN layer are alternately repeated 44 times in total. Thus, a multilayered-film reflector 104 with a reflectivity of approximately 99.8% and a reflection wavelength of 405 nm is obtained.

Example 2

Figure 18:
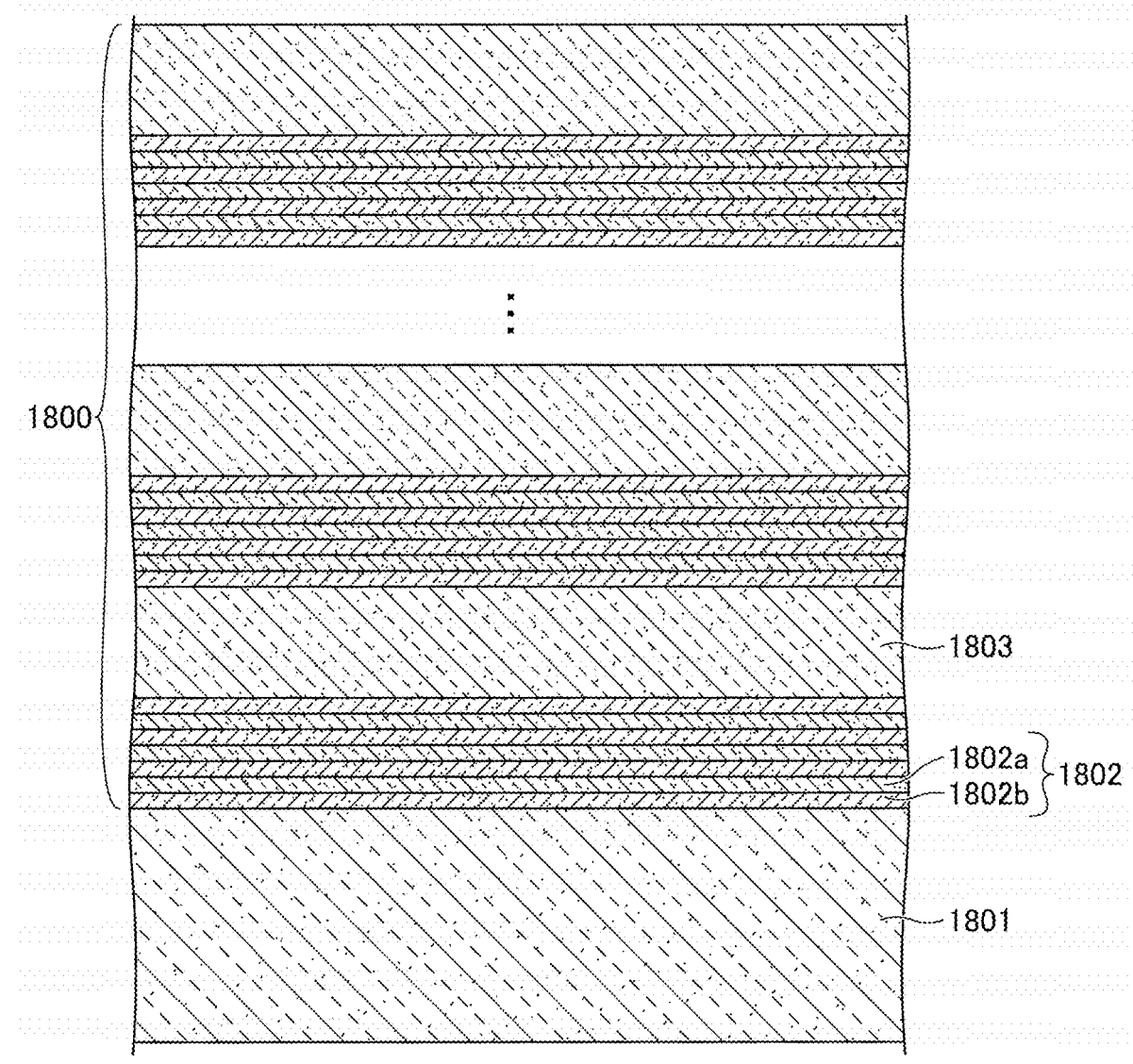
FIG. 18 is a cross-sectional view of a reflector according to second example.

The Example 2 relates to a structure of a reflector 1800 with a reflection wavelength of 450 nm and its manufacturing method. FIG. 18 is a cross-sectional view of a configuration of the reflector 1800 according to the present example.

The low refractive index layer 1802 is a multilayered film including four GaN layers with a film thickness of 9.7 nm and three Ga-doped AlN layers with a film thickness of 6 nm and an atomic (Ga) concentration ratio of 0.05.

The high refractive index layer 1803 is $In_{0.10}Ga_{0.90}N$ having a film thickness of 37 nm, and the low refractive index layer and the high refractive index layer are alternately formed 47 cycles in total. When the optical film thickness is calculated with the refractive index of GaN being 2.45, the refractive index of Ga-doped AlN being 2.0985, and the refractive index of $In_{0.10}Ga_{0.90}N$ being 2.49, the low refractive index layer has an optical film thickness of 72.7 nm, and the high refractive index layer has an optical film thickness of 92.1 nm. The high index layer is approximately 5.8% thinner than $\lambda/4$, and the low index layer is approximately 5.8% thicker than $\lambda/4$. In such a configuration, a ratio of the product of the strain and the film thickness of the Ga-doped AlN layer to the product of the strain and the film thickness of InGaN is 0.991, and the strain of the Ga-doped AlN is equal to the strain of InGaN.

The following describes the manufacturing method. A MOCVD device is used to manufacture nitride semiconductors. First, a GaN substrate 1801 is set in the reactor of the MOCVD device and heated. First, GaN of 2 µm is grown as a buffer layer at a temperature of 1100° C. to improve crystal quality. The temperature of the substrate is lowered to 850° C., and a multilayered film of GaN 1802b and Ga-doped AlN layers 1802a having an atomic (Ga) concentration ratio of 0.05 is grown as the low refractive index layer 1802. The Ga-doped AlN layer has three layers with a thickness of 6 nm, and the GaN has three layers with a thickness of 9.7 nm. The GaN is grown first, and 3.5 cycles in total are grown. The gas conditions of the Ga-doped AlN layer are as follows: nitrogen atmosphere, a ratio of Ga supplied to TMA and TMG is 0.05, the sum of amounts of Ga supplied to TMA and TMI is 80 µmol/min; NH3 is 200 mmol/min; and the V/III ratio is 2500. The gas conditions of GaN are as follows: The TMG is 100 µmol/min; NH3 is 200 mmol/min; and the V/III ratio is 2000. The GaN continuously grows as AlN.

Next, $In_{0.10}Ga_{0.90}N$ 1803 having a film thickness of 37 nm is grown as the high refractive index layer 1803 with the temperature maintained at 850° C. The gas conditions are as follows: a nitrogen atmosphere, TMG of 100 µmol/mi, TMI of 70 µmol/min, NH3 of 200 mmol/min, and a V/III ratio of 1176. As the supply amounts of TMG and NH3 are the same as those of the GaN grown immediately before, the growth is continued.

After that, the low refractive index layer 1802 of the multilayered film of the Ga-doped AlN layers and the GaN layers and the high refractive index layer 1803 comprised of $In_{0.10}Ga_{0.90}N$ are alternately repeated 47 times in total. Thus, a multilayered-film reflector 1800 with a reflectivity of approximately 99.8% and a reflection wavelength of 450 nm is obtained.

Example 3

Figure 19:
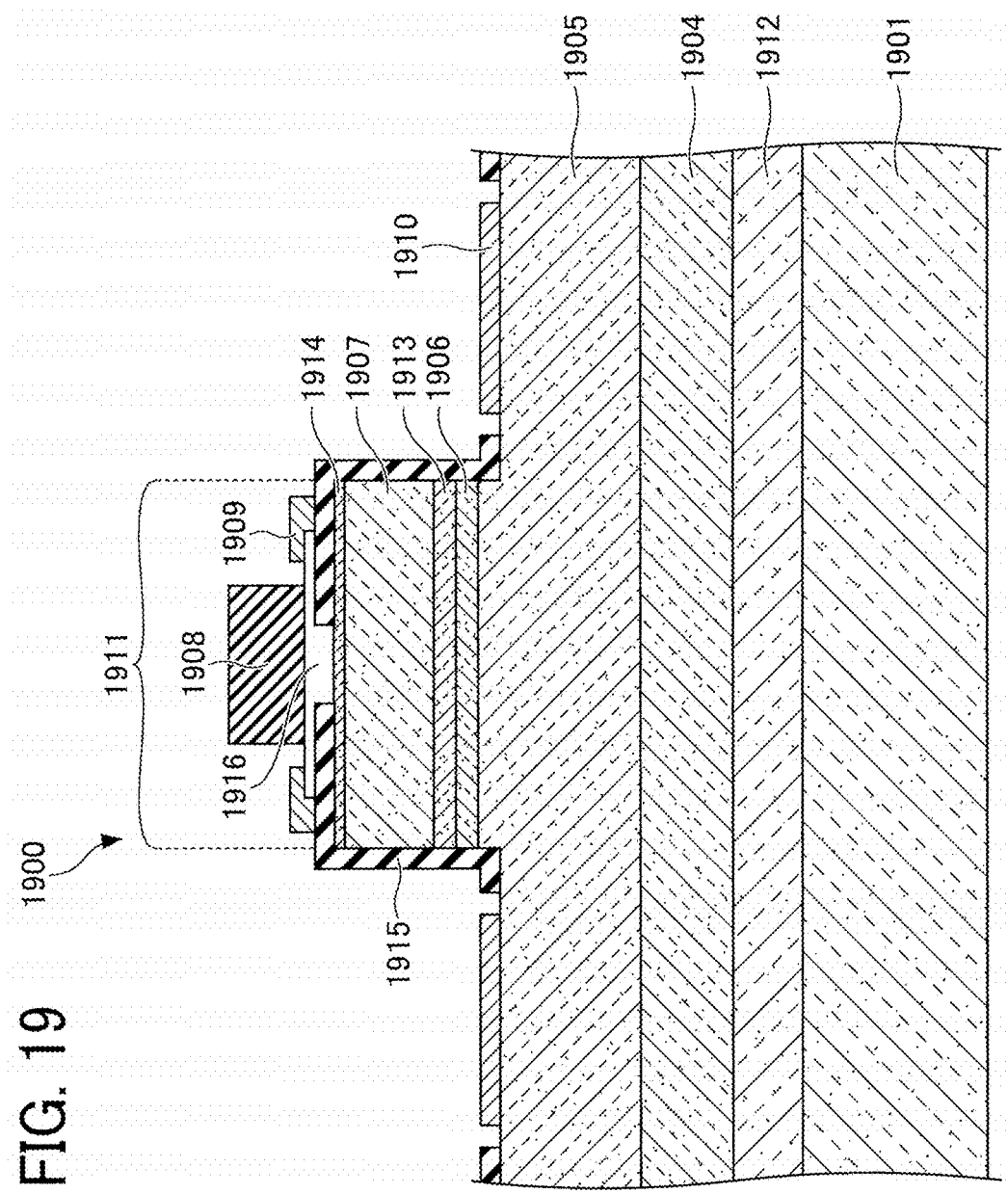
FIG. 19 is a cross-sectional view of a surface emitting laser according to a third example.

The present example relates to a surface-emitting laser with an oscillation wavelength of 405 nm according to the second embodiment, provided with the reflector according to Example 1. FIG. 19 is a cross-sectional of a configuration of a surface-emitting laser 1900 according to the present example.

In the present example, a GaN substrate is employed as the substrate 1901. Undoped GaN 1912 is grown by 1 µm as a buffer layer on the GaN substrate to improve crystal quality. Then, a reflector 1904, which is the reflector 100 according to Example 1, is grown as a first reflective layer. The manufacturing method is the same as in Example 1, and its description is omitted. An n-GaN 1905 having a film thickness of 1 µm is grown as a first semiconductor layer on the reflector 1904.

Subsequently, $In_{0.09}Ga_{0.91}N/GaN$ is grown three cycles to form a multi-quantum well (MQW) structure 1906. A well layer of $In_{0.09}Ga_{0.91}N$ has a film thickness of 6 nm, and a barrier layer of GaN has a film thickness of 4 nm. Next, $p-Al_{0.20}Ga_{0.80}N$ 1913 is grown by 20 nm as an electron block layer for strengthening the confinement of electrons in the active layer, and p-GaN 1907 is grown by 210 nm as a second semiconductor layer on the electron block layer.

Finally, p$^{++}$-GaN 1914 is grown by 5 nm as a contact layer to obtain ohmic contact with the electrode.

Next, the substrate is taken out of the reactor and etched by photolithography and RIE until n-GaN 1905 is exposed, to form a mesa structure 1911. Subsequently, an insulator film of SiO$_2$ 1915 with a thickness of 100 nm is formed to cover the substrate surface of the mesa structure 1911, so as to have passivation to prevent surface rebonding. Next, a part of the passivation film on the top of the mesa structure is removed in a circular pattern with a diameter of 8 μm by wet etching, and then a transparent electrode of ITO 1916 with a thickness of 20 nm is formed on the mesa structure to form a current constriction structure. Subsequently, a ring-shaped Ti/Au electrode 1909 is formed as a second electrode along the periphery of the ITO 1916. Further, a portion of SiO$_2$ around the mesa structure 1911 is removed by wet etching to form a Ti/Al electrode 1910 as a first electrode. Finally, the surface-emitting laser is completed by forming the dielectric DBR 1908 composed of Ta$_2$O$_5$/SiO$_2$ on the ITO 1916. The light reflector according to the present example enables a surface-emitting laser with a higher output power and a high heat dissipation to enable the heat to dissipate in the direction to the substrate.

Example 4

Figure 20:
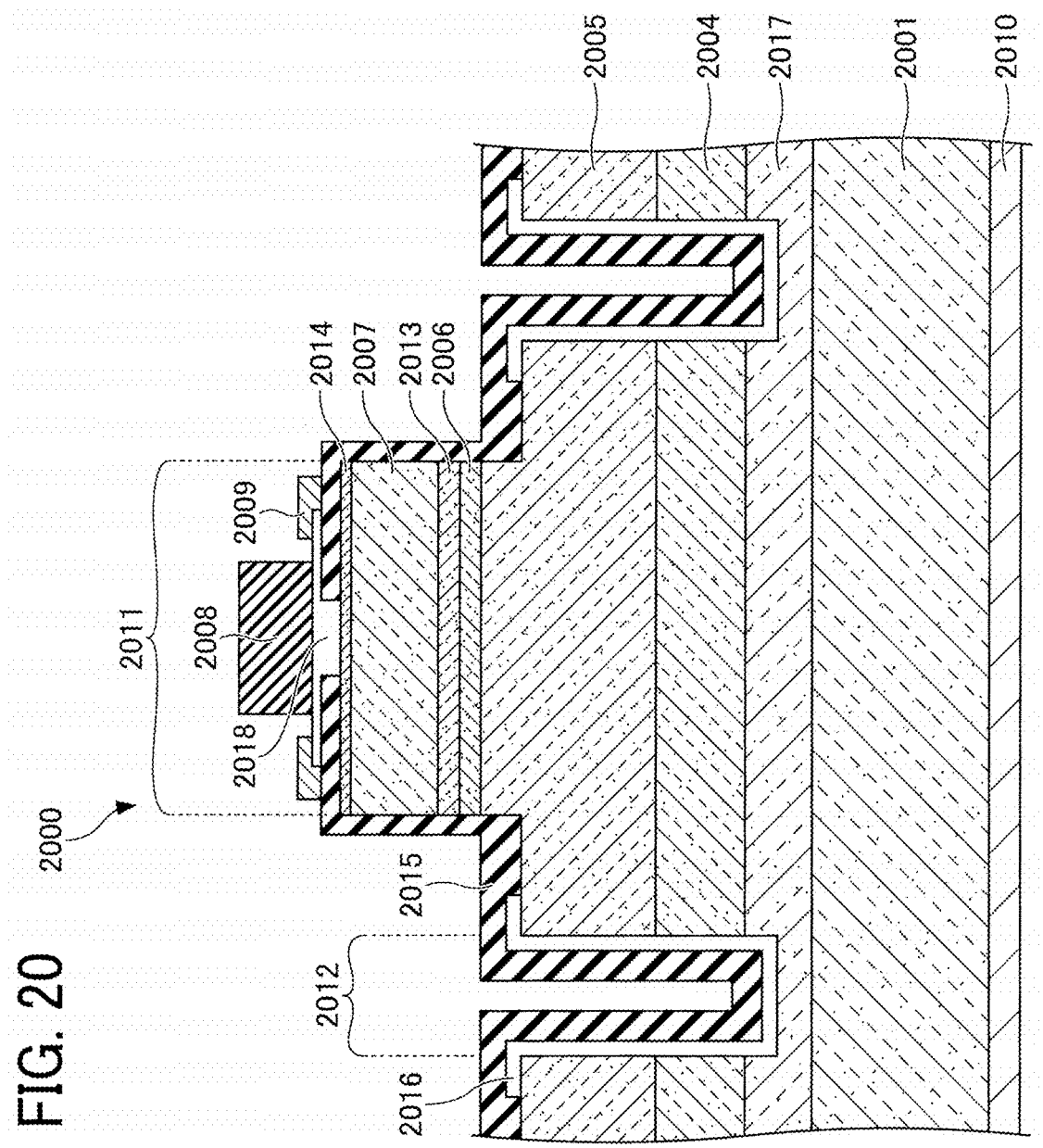
FIG. 20 is a cross-sectional view of a surface emitting laser according to a fourth example.

The present example relates to a surface-emitting laser with an oscillation wavelength of 450 nm according to the third embodiment, provided with the reflector according to Example 2. FIG. 20 is a cross-sectional of a configuration of a surface-emitting laser 2000 according to the present example.

An n-type GaN substrate 2001 is used as the substrate. An n-GaN 2017 doped with Si at a concentration of 3×10$^{18}$ cm$^{-3}$ is grown by 1 μm on the GaN substrate as a buffer layer to improve crystal quality and form ohmic contact with the conductive part. Then, a reflector 2004 (204) according to Example 2, is grown as a reflector. The manufacturing method is the same as in Example 2, and its description is omitted. An n-GaN 2005 having a film thickness of 1 μm is grown as a first semiconductor layer on the reflector 2004.

Subsequently, In$_{0.20}$Ga$_{0.80}$N/GaN is grown three cycles to form an MQW structure 2006. A well layer of In$_{0.20}$Ga$_{0.80}$N has a film thickness of 6 nm, and a barrier layer of GaN has a film thickness of 4 nm. Next, p-Al$_{0.20}$Ga$_{0.80}$N 1913 is grown by 20 nm as an electron block layer for strengthening the confinement of electrons in the active layer, and p-GaN 2007 is grown by 210 nm as a second semiconductor layer on the electron block layer. Finally, p$^{++}$-GaN 2014 is grown by 5 μm as a contact layer to obtain ohmic contact with the electrode.

Next, the substrate is taken out of the reactor and etched by photolithography and RIE until n-GaN 2005 is exposed, to form a mesa structure 2011. Subsequently, a conductive part 2012 is formed in the exposed area of the n-GaN 2005 around the mesa structure 2011. The conductive part 2012 is formed with a depth to allow the n-GaN (i.e, conductive part 2012) of the buffer layer to be exposed through the reflector 2004. A Ti/Al 2016 as a current-carrying part is formed inside the through hole of the conductive part 2012, to allow the n-GaN 2005 and the n-GaN (i.e., the conductive part 2021) to be electrically connected with each other.

The conductive part 2012 may have any shape to enable the n-GaN 2005 adjacent to the active layer and the n-GaN 2012 adjacent to the substrate to be electrically connected to each other. For example, the conductive part 2012 has a moat like shape surrounding the mesa structure 2011. In some other examples, the conductive part 2012 is circle or rectangular, and the mesa structure 2011 is surrounded by multiple conductive parts 2012.

After the mesa structure 2011, the Ti/Al 2016, and the current-carrying part inside the through hole of the conductive part 2012 are formed, AiO$_2$ 2015 as an insulator film is formed to cover the entire substrate surface. Next, a part of SiO$_2$ on the top of the mesa structure is removed in a circular pattern with a diameter of 8 μm by wet etching, and then, a transparent electrode of ITO 2018 with a thickness of 20 nm is formed on the mesa structure. Subsequently, a ring-shaped Ti/Au electrode 2009 is formed as a second electrode on the periphery of the ITO 2018. A Ti/Al electrode 2010 is formed as a first electrode on back side of the substrate. Finally, the surface-emitting laser is completed by forming the dielectric DBR 2008 composed of Ta$_2$O$_5$/SiO$_2$ on the ITO 2018.

The light reflector according to the present example enables a surface-emitting laser with a higher output power and a high heat dissipation to enable the heat to dissipate in the direction to the substrate.

Example 5

Figure 21:
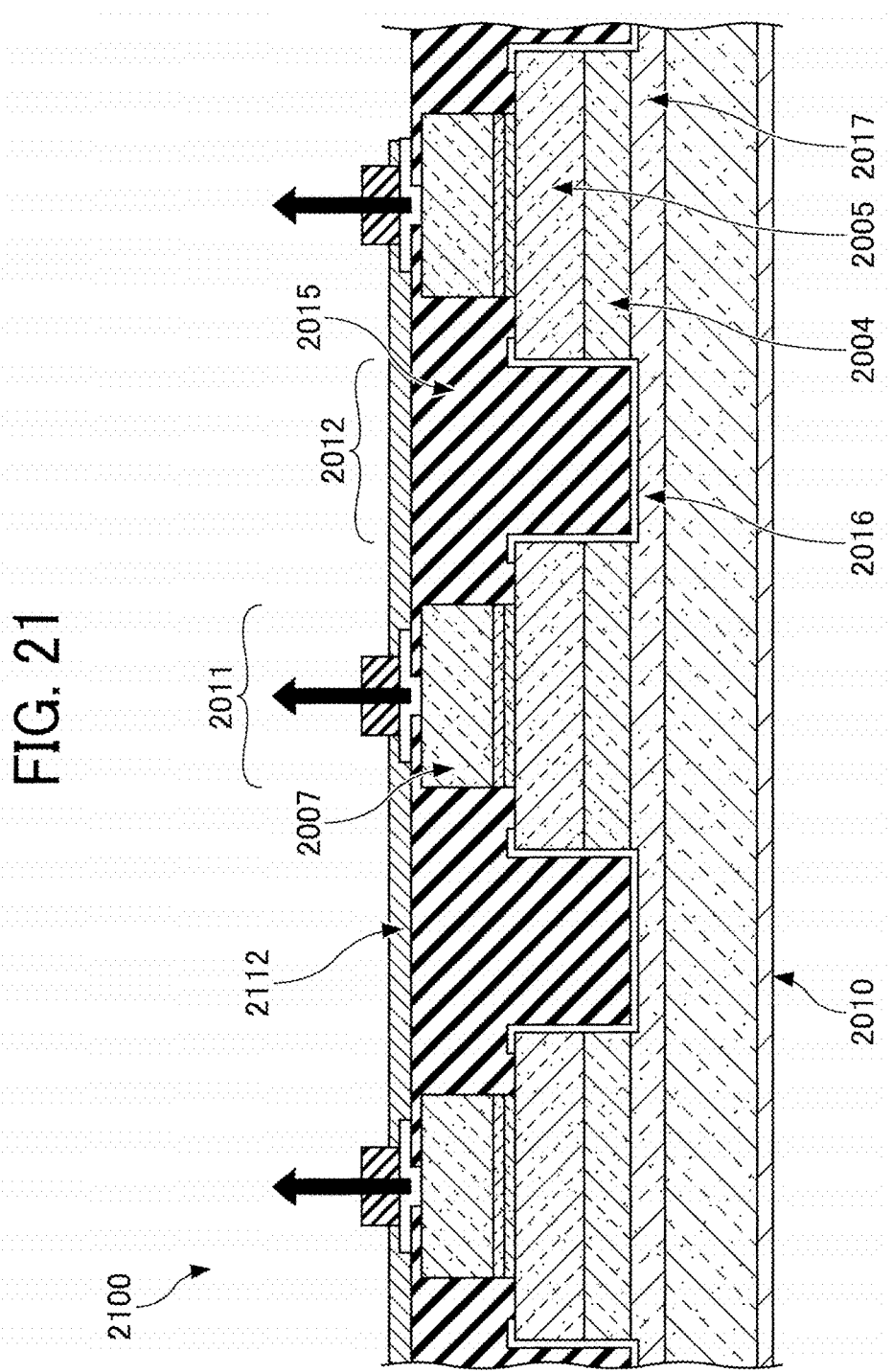
FIG. 21 is a cross-sectional view of an array light source according to a fifth example.

Next, Example 5 is described. The fifth embodiment is a specific example of the two-dimensional array light source according to the fourth embodiment. FIG. 21 is a cross-sectional view of a configuration of the two-dimensional array light source 2100. The layout of the surface-emitting lasers constituting the two-dimensional array light source 2100 is the same as in FIG. 5.

The two-dimensional array light source 2100 according to Example 5 includes multiple surface-emitting lasers according to Example 4 arranged in array. The description of the same features as in the fourth embodiment is omitted as appropriate, and a different configuration is described.

Instead of the ring-shaped electrode according to Example 4, Ti/Al electrode 2112 is used as a common electrode to electrically connect all the ITOs 2018 on the mesa structures 2011 with each other, so as to simultaneously apply current to all the elements.

In the present example, the pitch of the surface emitting laser (i.e., distance between the centers of the surface emitting lasers closest to each other) is 40 μm, the mesa structure 2011 has a diameter of 28 μm, and the distance between the mesa structure 2011 and the conductive part 2012 is 3 μm. This configuration enables approximately 36000 surface-emitting lasers to be arranged per 1 cm square. Such a high heat-heat-dissipative surface-emitting laser enables all the elements to be driben at the same time.

Example 6

The Example 6 relates to a structure with a reflection wavelength of 450 nm and its manufacturing method. The structure of a multilayered-film reflector according to the present example, which is the same as the reflector 109 is described with reference to FIG. 22.

In the present example, a GaN substrate is employed as the substrate 101. The low refractive index layer is a multilayer film including three GaN layers with a film thickness of 7.5 nm and two In-doped AlN layers with a film thickness of 11 nm and an atomic (In) concentration ratio of less than 0.01.

The high refractive index layer 103 is In$_{0.10}$Ga$_{0.90}$N having a film thickness of 50 nm, and the low refractive index layer and the high refractive index layer are alternately formed for a total of 35 cycles. When the optical film thickness is calculated with the refractive index of GaN being 2.45, the refractive index of In-doped AlN being 2.08, and the refractive index of $In_{0.10}Ga_{0.90}N$ being 2.47, the low refractive index layer has an optical film thickness of 100.9 nm, and the high refractive index layer has an optical film thickness of 123.5 nm. The high index layer is approximately 10% thinner than $\lambda/4$, and the low index layer is approximately 10% thicker than $\lambda/4$. In such a configuration, a ratio of the product of the strain and the film thickness of the Ga-doped MN layer to the product of the strain and the film thickness of InGaN is 0.978, and the strain of the In-doped AlN is equal to the strain of InGaN.

The following describes the manufacturing method. A MOCVD device is used to manufacture nitride semiconductors. First, a GaN substrate is set in the reactor of the MOCVD device and heated. The temperature of the substrate is heated to 1050° C., and a multilayered film of GaN 102b and In-doped AlN layers 102c having an atomic (In) concentration ratio of less than 0.01 is grown as the low refractive index layer 102. The In-doped MN layer has two layers with a thickness of 11 nm, and the GaN has three layers with a thickness of 7.5 nm. The GaN is grown first, and 3.5 cycles in total are grown. The first layer of GaN grows in a nitrogen atmosphere, and the subsequent layers grow in a hydrogen atmosphere. The gas conditions of the Ga-doped MN layer are as follows: Al ratio of In suppled to TMA and TMI is 0.10; The sum of amounts of In supplied to TMA and TMI is 80 mol/min; NH3 is 200 mmol/mini; and the V/III ratio is 2500. The gas conditions of GaN are as follows: The TMG is 100 mmol/min; NH3 is 200 mmol/min; and the V/III ratio is 2000.

Next, the temperature of the substrate is lowered by 150° C. over 1 minute and 30 seconds to 900° C. As the high refractive index layer 103, $In_{0.10}Ga_{0.90}N$ 103 having a film thickness of 50 nm is grown. The gas conditions are as follows: a nitrogen atmosphere, TMG of 100 μmol/mi, TMI of 70 μmol/min, NH3 of 200 mmol/min, and a V/III ratio of 1176.

Next, in order to grow the low refractive index layer 102 of the multilayered film of In-doped AlN layers and the GaN layers, the temperature of the substrate is raised by 150° C. over 1 minute to 1050° C. The total time required for raising and lowering the temperature is 2 minutes and 30 seconds, which does not impair productivity.

After that, the low refractive index layer 102 of the multilayered film of the In-doped MN layers and the GaN layers and the high refractive index layer 103 comprised of $In_{0.10}Ga_{0.90}N$ are alternately repeated 35 times in total. Thus, a multilayered-film reflector 109 with a reflectivity of approximately 99.8% and a reflection wavelength of 450 nm is obtained.

Although the preferred embodiments have been described in detail above, the present disclosure is not limited to the above-described embodiments, and various modifications and substitutions may be made to the above-described embodiments without departing from the scope described in the claims.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A reflector comprising:
   a first refractive index layer having a first average refractive index, the first refractive index layer including a laminate of alternate Ga-doped AlN layers and layers consisting essentially of GaN; and
   a second refractive index layer having a second average refractive index, the second refractive index layer including an InGaN layer, and
   the second average refractive index being higher than the first average refractive index,
   wherein the first average refractive index is obtained by dividing a sum of products of an optical film thickness and a refractive index of each layer of the first refractive index layer, by a total optical film thickness of the first refractive index layer, and
   wherein the second average refractive index is a refractive index of the InGaN layer of the second refractive index layer.

2. The reflector according to claim 1,
   wherein an atomic concentration ratio of Ga in Ga-doped AlN of the Ga-doped AlN layers is greater than 0 and less than or equal to 0.10.

3. The reflector according to claim 1,
   wherein the second refractive index layer has the total optical film thickness different from the total optical film thickness of the first refractive index layer.

4. The reflector according to claim 3,
   wherein the second refractive index layer has the total optical film thickness greater than the total optical film thickness of the first refractive index layer.

5. The reflector according to claim 1,
   wherein In composition of the InGaN layer is greater than or equal to 0.03 and less than 0.20.

6. A reflector comprising:
   a first refractive index layer having a first average refractive index, the first refractive index layer including a laminate of alternate In-doped AlN layers and GaN layers; and
   a second refractive index layer having a second average refractive index, the second refractive index layer including an InGaN layer, and
   the second average refractive index being higher than the first average refractive index,
   wherein the first average refractive index is obtained by dividing a sum of products of an optical film thickness and a refractive index of each layer of the first refractive index layer, by a total optical film thickness of the first refractive index layer, and
   wherein the second average refractive index is a refractive index of the InGaN layer of the second refractive index layer.

7. The reflector according to claim 6,
   wherein an atomic concentration ratio of In in In-doped AlN is greater than 0 and less than or equal to 0.05.

8. A surface-emitting laser comprising:
   a first reflecting layer including the reflector according to claim 1;
   a second reflecting layer; and
   an active layer between the first reflecting layer and the second reflecting layer.

9. The surface-emitting laser according to claim 8, further comprising:

a first semiconductor layer between the active layer and the first reflecting layer;

a second semiconductor layer between the active layer and the second reflecting layer;

a conductive layer overlaid by the first reflecting layer; and a conductive part configured to electrically connect the first semiconductor layer with the substrate, wherein a laminate of at least the second semiconductor layer and the active layer has a mesa structure.

10. The surface-emitting laser according to claim 9, wherein the conductive part includes:

a through hole penetrating the first reflecting layer; and a current-carrying part provided at at least a part of an interior of the through hole, the current-carrying part having one end connected with the first semiconductor layer and the other end connected with the substrate.

11. A light source comprising a plurality of surface-emitting lasers according to claim 8.

12. A light source comprising a plurality of surface-emitting lasers according to claim 9, wherein each of the mesa structures is surrounded by the conductive part.

13. The light source according to claim 12, wherein the conductive part includes multiple conductive parts, each of the mesa structures is surrounded by at least two of the conductive parts, and each of the conductive parts is shared by at least two of the mesa structures.

14. The light source according to claim 12, wherein adjacent mesa structures of the mesa structures are arranged to form grid points, the conductive part includes multiple conductive parts, and each of the conductive parts is at the center of gravity of a corresponding set of the grid points.

15. A projection device comprising the surface-emitting laser according to claim 8.

16. A display device comprising the surface-emitting laser according to claim 8.

17. A light-emitting device comprising the surface-emitting laser according to claim 8.

18. The reflector according to claim 1, wherein the second refractive index layer is a laminate including the InGaN layer, and the second average refractive index is obtained by dividing a sum of products of an optical film thickness and a refractive index of each layer of the second refractive index layer, by a total optical film thickness of the second refractive index layer.

19. The reflector according to claim 6, wherein the second refractive index layer is a laminate including the InGaN layer, and the second average refractive index is obtained by dividing a sum of products of an optical film thickness and a refractive index of each layer of the second refractive index layer, by a total optical film thickness of the second refractive index layer.

* * * * *